United States Patent
Zerbe et al.

(10) Patent No.: US 10,951,218 B2
(45) Date of Patent: Mar. 16, 2021

(54) MULTI-MODE CLOCK MULTIPLIER

(71) Applicant: Rambus Inc., Sunnyvale, CA (US)

(72) Inventors: Jared L. Zerbe, Woodside, CA (US); Brian S. Leibowitz, San Francisco, CA (US); Masum Hossain, Edmonton (CA)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 16/813,156

(22) Filed: Mar. 9, 2020

(65) Prior Publication Data
US 2020/0350918 A1    Nov. 5, 2020

Related U.S. Application Data

(63) Continuation of application No. 16/247,894, filed on Jan. 15, 2019, now Pat. No. 10,608,652, which is a
(Continued)

(51) Int. Cl.
*H03L 7/16* (2006.01)
*H03L 7/06* (2006.01)
(Continued)

(52) U.S. Cl.
CPC ............. *H03L 7/16* (2013.01); *H03K 3/0315* (2013.01); *H03K 5/00006* (2013.01); *H03K 5/13* (2013.01);
(Continued)

(58) Field of Classification Search
CPC ..... H03L 7/16; H03L 7/24; H03L 7/06; H03L 7/0995; H03K 3/0315; H03K 5/13; H03K 5/14
(Continued)

(56) References Cited

U.S. PATENT DOCUMENTS 5,122,677 A   6/1992  Sato
5,142,247 A   8/1992  Lada, Jr. et al.
(Continued)

OTHER PUBLICATIONS

Adler, Robert, "A Study of Locking Phenomena in Oscillators," Jun. 1946, Proceedings of the I.R.E. and Waves and Electrons, pp. 351-357. 7 pages.
(Continued)

*Primary Examiner* — John W Poos
(74) *Attorney, Agent, or Firm* — Charles Shemwell

(57) ABSTRACT

In a first clock frequency multiplier, multiple injection-locked oscillators (ILOs) having spectrally-staggered lock ranges are operated in parallel to effect a collective input frequency range substantially wider than that of a solitary ILO. After each input frequency change, the ILO output clocks may be evaluated according to one or more qualifying criteria to select one of the ILOs as the final clock source. In a second clock frequency multiplier, a flexible-injection-rate injection-locked oscillator locks to super-harmonic, sub-harmonic or at-frequency injection pulses, seamlessly transitioning between the different injection pulse rates to enable a broad input frequency range. The frequency multiplication factor effected by the first and/or second clock frequency multipliers in response to an input clock is determined on the fly and then compared with a programmed (desired) multiplication factor to select between different frequency-divided instances of the frequency-multiplied clock.

20 Claims, 14 Drawing Sheets

Related U.S. Application Data continuation of application No. 15/644,632, filed on Jul. 7, 2017, now Pat. No. 10,205,458, which is a continuation of application No. 15/130,802, filed on Apr. 15, 2016, now Pat. No. 9,735,791, which is a continuation of application No. 14/565,802, filed on Dec. 10, 2014, now Pat. No. 9,344,074, which is a continuation of application No. 13/983,836, filed as application No. PCT/US2012/039268 on May 24, 2012, now Pat. No. 8,941,420.

(60) Provisional application No. 61/504,155, filed on Jul. 1, 2011.

(51) Int. Cl.
| | |
|---|---|
| *H03L 7/099* | (2006.01) |
| *H03K 5/00* | (2006.01) |
| *H03K 5/13* | (2014.01) |
| *H03K 3/03* | (2006.01) |
| *H03K 5/14* | (2014.01) |
| *H03L 7/24* | (2006.01) |

(52) U.S. Cl.
CPC ............... *H03K 5/14* (2013.01); *H03L 7/06* (2013.01); *H03L 7/0995* (2013.01); *H03L 7/24* (2013.01); *H03J 2200/10* (2013.01)

(58) Field of Classification Search
USPC .......................................................... 327/39
See application file for complete search history.

(56) References Cited

U.S. PATENT DOCUMENTS

| | | | |
|---|---|---|---|
| 5,394,114 | A | 2/1995 | Davis |
| 6,380,774 | B2 | 4/2002 | Saeki |
| 6,466,073 | B1 | 10/2002 | Yukinari et al. |
| 6,781,470 | B2 | 8/2004 | Rogerson |
| 6,961,862 | B2 | 11/2005 | Best et al. |
| 7,940,830 | B2 | 5/2011 | Marsili et al. |
| 7,948,812 | B2 | 5/2011 | Ware |
| 8,174,325 | B1 | 5/2012 | Leung et al. |
| 8,258,830 | B2 | 9/2012 | Liang et al. |
| 8,508,268 | B2 | 8/2013 | Shima |
| 8,804,397 | B2 | 8/2014 | Aleksic et al. |
| 2004/0088619 | A1 | 5/2004 | Hsu et al. |
| 2005/0265437 | A1 | 12/2005 | Yeung et al. |
| 2007/0285140 | A1 | 12/2007 | Kubo |
| 2009/0088113 | A1 | 4/2009 | Marsili et al. |
| 2009/0102569 | A1 | 4/2009 | McCoy |
| 2009/0167441 | A1 | 7/2009 | Song et al. |
| 2009/0175116 | A1 | 7/2009 | Song et al. |

OTHER PUBLICATIONS

Carusone, Tony Chan, "Injection-Locking for High-Speed Wireline Communication," University of Toronto, Apr. 15, 2010. 14 pages.
Casper et al., "A 20Gb/s Forwarded Clock Transceiver in 90nm CMOS," 4.6, ISSCC 2006 Session 4. 10 pages.
Farjad-Rad et al., "A 33-mW 8-Gb/s CMOS Clock Multiplier and CDR for Highly Integrated I/Os," IEEE Journal of Solid-State Circuits, vol. 39, No. 9, Sep. 2004, pp. 1553-1561. 9 pages.
Hossain et al., "5-10 Gb/s 70 mW Burst Mode AC Coupled Receiver in 90-nm CMOS," IEEE Journal of Solid-State Circuits, vol. 45, No. 3, Mar. 2010, pp. 524-537. 14 pages.
Hossain et al., "A 6.8mW 7.4Gb/s Clock-Forwarded Receiver with up to 300MHz Jitter Tracking in 65nm CMOS," ISSCC 2010. Session 8, High-Speed Wireline Transceivers 8.2, pp. 158-160. 3 pages.
Hossain et al., "CMOS Oscillators for Clock Distribution and Injection-Locked Deskew," IEEE Journal of Solid-State Circuits, vol. 44, No. 8, pp. 2138-2153, Aug. 2009. 16 pages.
Hu et al., "A 0.6 mW/Gb/s, 6.4-7.2 Gb/s Serial Link Receiver Using Local Injection-Locked Ring Oscillators in 90 nm CMOS," IEEE Journal of Solid-State Circuits, vol. 45, No. 4, Apr. 2010, pp. 899-908. 10 pages.
Hu et al., "A 0.6mW/Gbps, 6.4-8.0Gbps Serial Link Receiver Using Local Injection-Locked Ring Oscillators in 90nm CMOS," 2009 Symposium on VLSI Circuits Digest of Technical Papers. 2 pages.
Jaussi et al., "A 20Gb/s Embedded Clock Transceiver in 90nm CMOS," 18.8, ISSCC 2006 Session 18. 10 pages.
Kratyuk et al., "Frequency Detector for Fast Frequency Lock of Digital PLLs," Electronic Letters, vol. 43, No. 1, pp. 13-14, Jan. 4, 2007. 2 pages.
Lai et al., "Capturing Oscillator injection Locking via Nonlinear Phase-Domain Macromodels," IEEE Transactions on Microwave Theory and Techniques, vol. 52, No. 9, Sep. 2004, pp. 2251-2261. 11 pages.
Lee et al., "Paper 5.2: Subharmonically Injection-Locked PLLs for Ultra-Low-Noise Clock Generation," Slides, 2009 IEEE International Solid-State Circuits Conference. 32 pages.
Lee et al., "Subharmonically Injection-Locked PLLs for Ultra-Low-Noise Clock Generation," ISSCC 2009, Session 5, 5.2, pp. 91-93. 3 pages.
Maffezzoni, Paolo, "Analysis of Oscillator Injection Locking Through Phase-Domain Impulse-Response," IEEE Transactions on Circuits and Systems—I: Regular Papers, vol. 55, No. 5, Jun. 2008; pp. 1297-1305. 9 pages.
Mahony et al., "A 27Gb/s Forwarded-Clock I/O Receiver Using an Injection-Locked LC-DCO in 45nm CMOS," 25.1, ISSCC 2008 Session 25, pp. 452-453, 627. 3 pages.
Mahony et al., "Paper 25.1: A 27Gb/s Forwarded-Clock I/O Receiver using an Injection-Locked LC-DCO in 45nm CMOS," IEEE international Solid-State Circuits 2008. 39 pages.
Mirzaei et al., "Multi-Phase injection Widens Lock Range of Ring-Oscillator-Based Frequency Dividers," IEEE Journal of Solid-State Circuits, vol. 43, No. 3, Mar. 2008, pp. 656-671. 16 pages.
Ng et al., "A Second-Order Semidigital Clock Recovery Circuit Based on Injection Locking," IEEE Journal of Solid-State Circuits; vol. 38, No. 12, Dec. 2003, pp. 2101-2110 and corresponding ISSCC 2003 Session 4 paper 4.3. 18 pages.
O'Mahony et al., "A Programmable Phase Rotator Based on Time-Modulated Injection-Locking," 2010 IEEE Symposium on VLSI Circuits (VLSIC), Honolulu, HI, Jun. 16-18, 2010, pp. 45-46. 2 pages.
Paciorek, L.J., "Injection Locking of Oscillators," Nov. 1965, Proceedings of the IEEE, vol. 53, No. 11, pp. 1723-1728. 6 pages.
PCT International Preliminary Report on Patentability dated Jan. 16, 2014 (Chapter I) in International Application No. PCT/US2012/039268. 12 pages.
PCT International Search Report and Written Opinion dated Dec. 20, 2012 in International Application No. PCT/US2012/039268. 15 pages.
Rategh et al., "Superharmonic Injection-Locked Frequency Dividers," IEEE Journal of Solid-State Circuits, vol. 34, No. 6, pp. 813-821, Jun. 1999. 9 pages.
Razavi, Behzad, "A Study of Injection Locking and Pulling in Oscillators," IEEE Journal of Solid-State Circuits, vol. 39, No. 9, Sep. 2004, pp. 1415-1424. 10 pages.
Shekhar et al., "Strong injection Locking in Low-Q LC Oscillators: Modeling and Application in a Forwarded-Clock I/O Receiver," IEEE Transactions on Circuits and Systems—I: Regular Papers, vol. 56, No. 8, Aug. 2009. pp. 1818-1829. 12 pages.
Vanassche et al., "On the Difference Between Two Widely Publicized Methods for Analyzing Oscillator Phase Behavior," 2002; IEEE, pp. 229-233. 5 pages.
Zhang et al., "Injection-Locked Clocking: A New GHz Clock Distribution Scheme," IEEE 2006 Custom Integrated Circuits Conference (CCC), pp. 785-788. 4 pages.

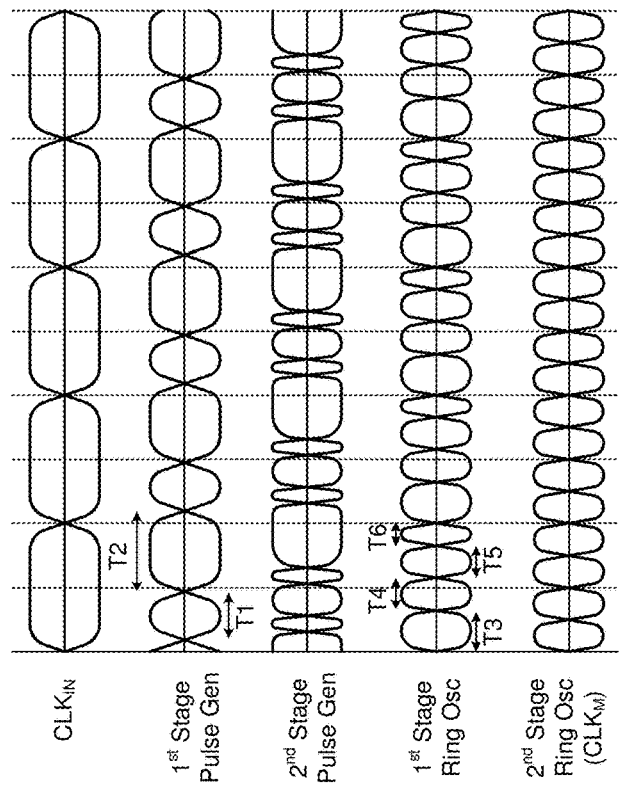
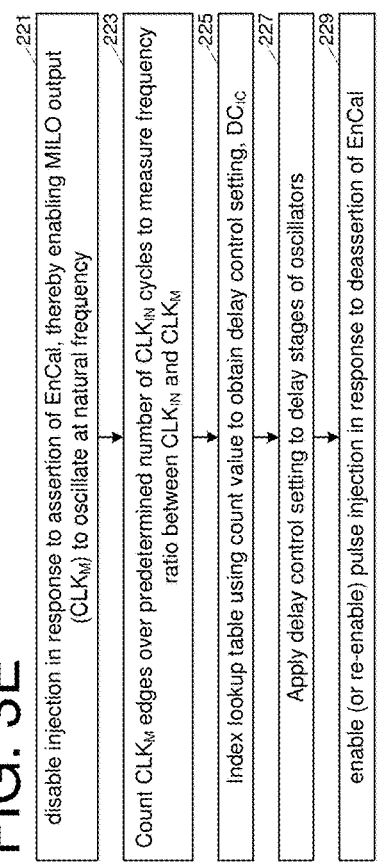
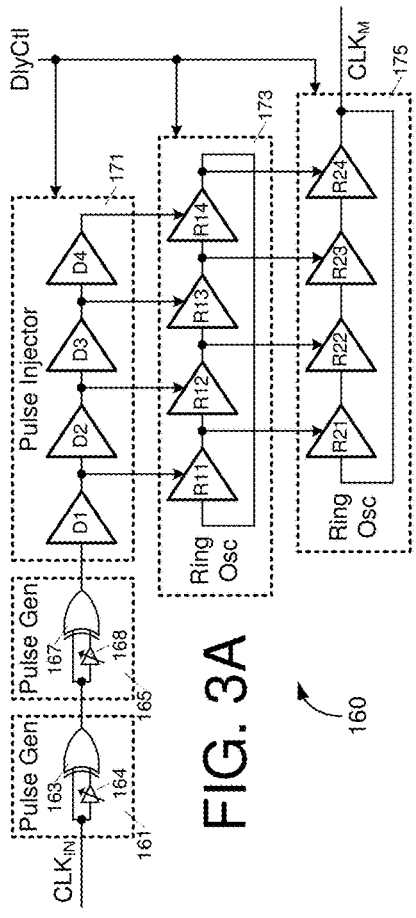
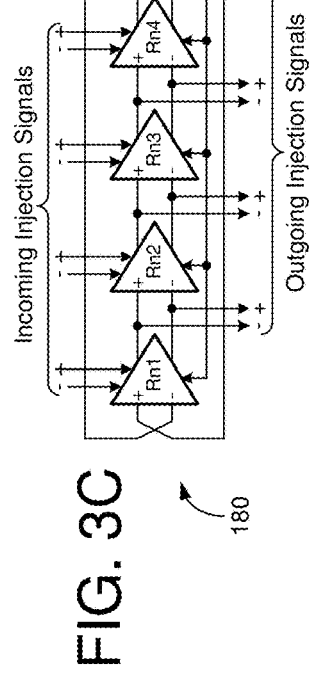
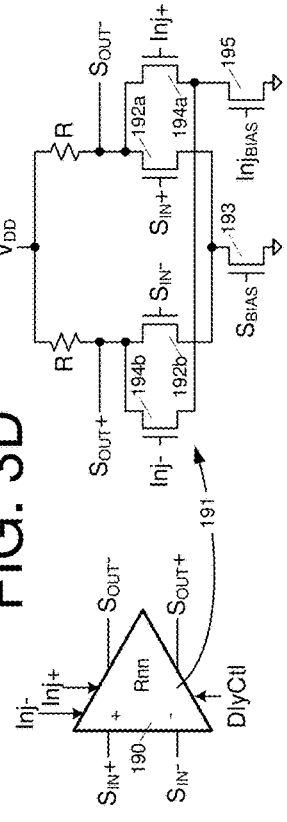

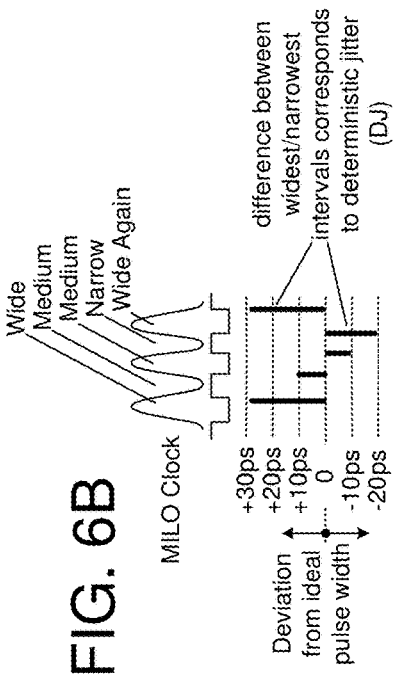
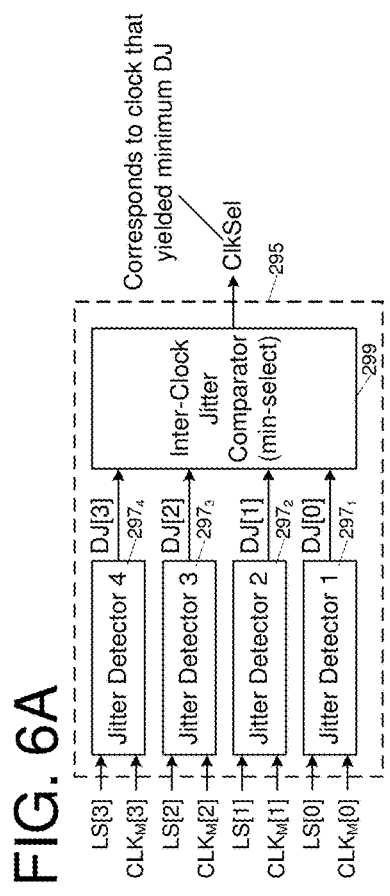
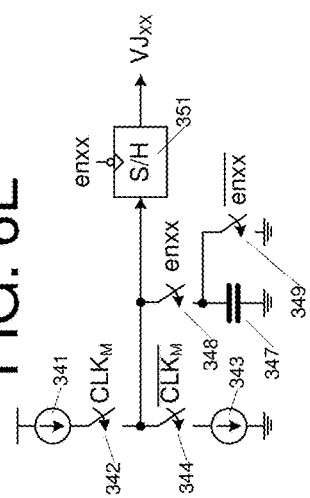
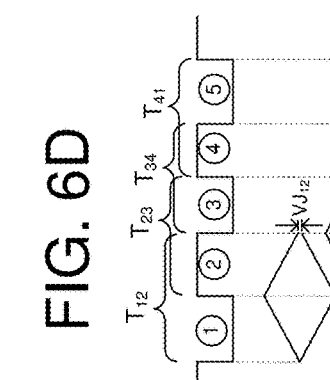
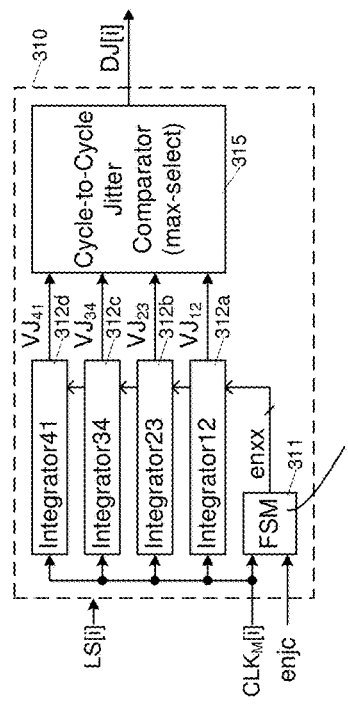
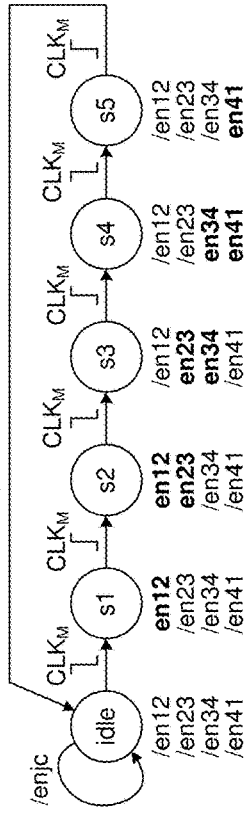

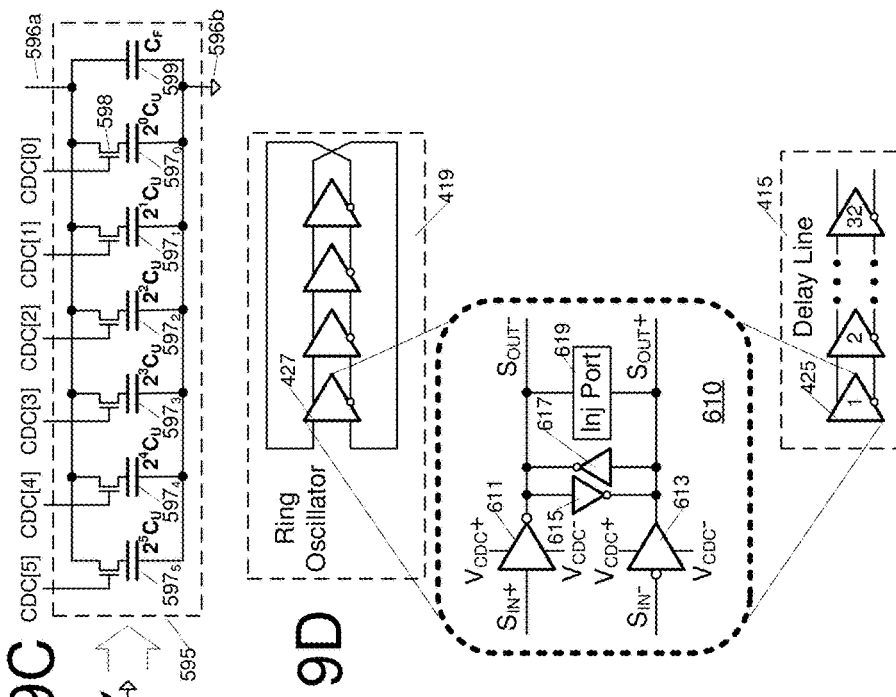
Fig. 9B
Fig. 9C
Fig. 9D
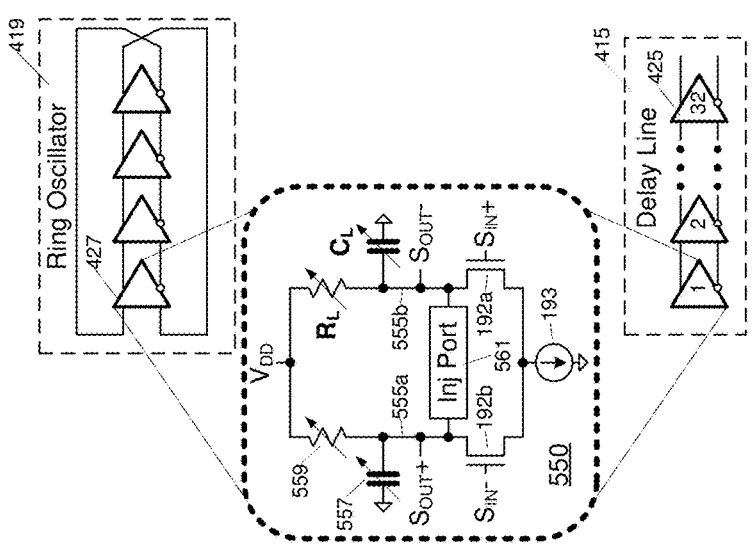
Fig. 9A

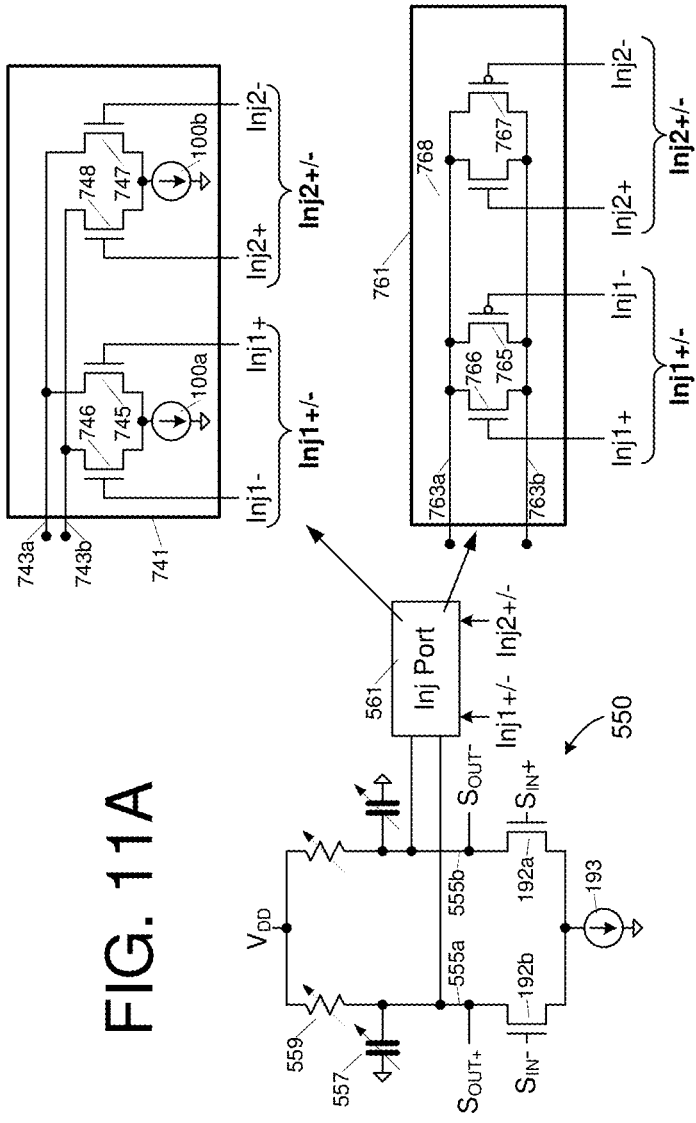
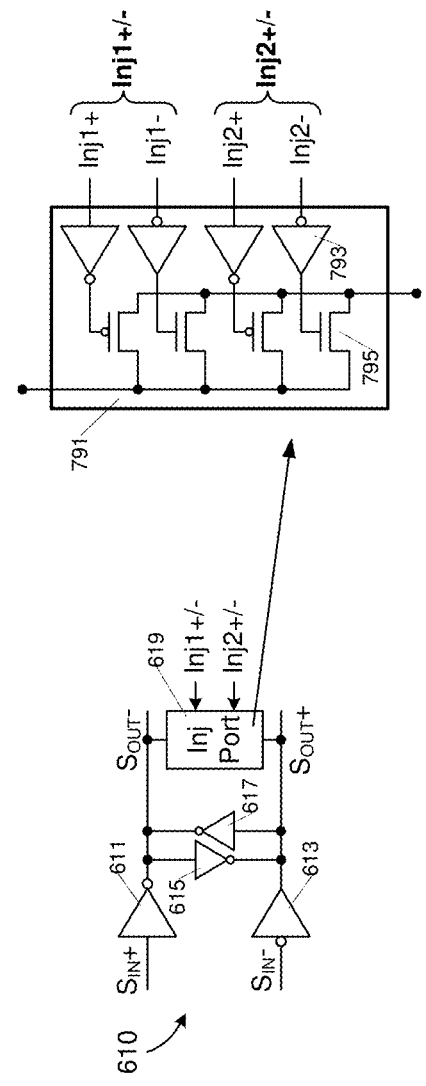
FIG. 11A
FIG. 11B

MULTI-MODE CLOCK MULTIPLIER

CROSS REFERENCE TO RELATED APPLICATIONS

This application is a continuation of U.S. patent application Ser. No. 16/247,894 filed Jan. 15, 2019 (now U.S. Pat. No. 10,608,652), which is a continuation of U.S. patent application Ser. No. 15/644,632 filed Jul. 7, 2017 (now U.S. Pat. No. 10,205,458), which is a continuation of U.S. patent application Ser. No. 15/130,802 filed Apr. 15, 2016 (now U.S. Pat. No. 9,735,791), which is a continuation of U.S. patent application Ser. No. 14/565,802 filed Dec. 10, 2014 (now U.S. Pat. No. 9,344,074), which is a continuation of U.S. patent application Ser. No. 13/983,836 filed Aug. 6, 2013 (now U.S. Pat. No. 8,941,420), which is a U.S. National Stage of International Application No. PCT/US2012/039268 filed May 24, 2012, which claims priority to U.S. Provisional Patent Application No. 61/504,155 filed Jul. 1, 2011. Each of the above-identified patent applications is hereby incorporated by reference in its entirety.

TECHNICAL FIELD

The present invention relates generally to the field of integrated circuits, and more particularly to clock generation in integrated circuits and systems of integrated circuit devices.

BACKGROUND

Frequency-agile clocking has emerged as an effective power-conservation technique in mobile devices. Ideally, the system clock that serves as a primary timing reference for functional operations is switched instantly between various frequencies, scaling power consumption according to the work at hand. In practice, latency (delay) can be incurred at each frequency transition as frequency-multiplier circuitry stabilizes the system clock at its new frequency following each frequency change.

Unfortunately, conventional phase-locked loop (PLL) multipliers require relatively long re-lock times following frequency changes and thus, despite potential broad input frequency range, incur precisely the latency penalties to be avoided in a frequency-agile system. Conversely, injection-locked oscillators exhibit fast lock times, but tend to have a narrow input frequency range and thus limited frequency agility.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3A illustrates an of a MILO that may be used to implement any or all of the MILOs shown in FIG. 2A;

FIG. 3B is a timing diagram illustrating an exemplary operation of the MILO shown in FIG. 3A;

FIG. 3C illustrates an embodiment of a ring oscillator that may be used to implement either or both of the ring oscillator stages depicted in FIG. 3A;

FIG. 3D illustrates an embodiment of a delay element that may be used to implement any of the delay elements within the ring oscillators of FIGS. 3A and 3C, and/or within the pulse injector of FIG. 3A;

FIG. 3E illustrates an exemplary tuning operation that may be executed to adjust the natural frequency of the MILO shown in FIG. 3A (or the MILOs shown in FIG. 1 or 2A);

FIG. 6A illustrates an embodiment of a jitter comparator that may be used to implement the jitter comparator within the qualifying logic of FIG. 4;

FIG. 6B illustrates deterministic jitter in an exemplary MILO output;

FIG. 6C illustrates an embodiment of a jitter detector that may be used to implement individual jitter detectors within the jitter comparator of FIG. 6A;

FIG. 6D illustrates an exemplary integration intervals allocated to respective integrators within the jitter detector of FIG. 6C;

FIG. 6E illustrates an embodiment of an integrator that may be used to implement the individual integrators shown within the jitter detector of FIG. 6C;

FIG. 6F illustrates an embodiment of an inter-cycle jitter comparator that may be used to implement the cycle-to-cycle jitter comparator of FIG. 6C;

FIG. 9A illustrates an embodiment of a current-mode-logic (CML) delay element (or delay stage) that may be used to implement delay elements within the delay line and ring oscillator of FIG. 7;

FIG. 9B illustrates a variable-resistance element that may be used to implement the variable-resistance element within the CML delay element of FIG. 9A;

FIG. 9C illustrates a variable-capacitance element that may be used to implement the variable-capacitance element within the CML delay element of FIG. 9A;

FIG. 9D illustrates an embodiment of a CMOS (complementary metal oxide semiconductor) delay element that may be used to implement delay elements within the delay line and ring oscillator of FIG. 7;

FIG. 11A illustrates embodiments of injection ports that may be used to enable injection-locking oscillation within a ring of CML delay stages;

FIG. 11B illustrates embodiments of injection ports that may be used to enable injection-locking oscillation within a ring of CMOS delay stages;

DETAILED DESCRIPTION

Low-latency, frequency-agile clock multipliers and systems containing same are disclosed in various embodiments herein. In one embodiment, multiple injection-locked oscillators (ILOs) having spectrally-staggered lock ranges are operated in parallel to effect a collective input frequency range substantially wider than that of a solitary ILO, thus achieving the dual benefits of fast locking and wide input frequency range. After each input frequency change, the ILO output clocks are evaluated according to one or more qualifying criteria to select one of the ILOs as the final clock source and (optionally) disable the remaining ILOs until the next input frequency change.

In another embodiment, a flexible-injection-rate ILO locks to super-harmonic, sub-harmonic or at-frequency injection pulses, seamlessly transitioning between the different injection pulse rates to enable a broad input frequency range. The flexible-injection-rate ILO (also referred to herein as a flexible clock multiplier (FCM)), may also be operated in different modes, performing a frequency-scaling operation in a fixed-multiplier mode, and a multiplier-scaling operation in a fixed-frequency mode.

In other embodiments, the net multiplication factor effected within a clock multiplier may be unknown when the clock multiplier is initially powered up (or after a frequency change) and instead determined (or detected) by comparing the multiplier input and output clocks. The detected multiplication factor may then be compared with a programmed (desired) multiplication factor to select between different frequency-divided instances of the clock multiplier output, and thus yield a final output clock that is a desired frequency-multiple of the multiplier input clock. These and other embodiments are discussed in further detail below.

Figure 1:
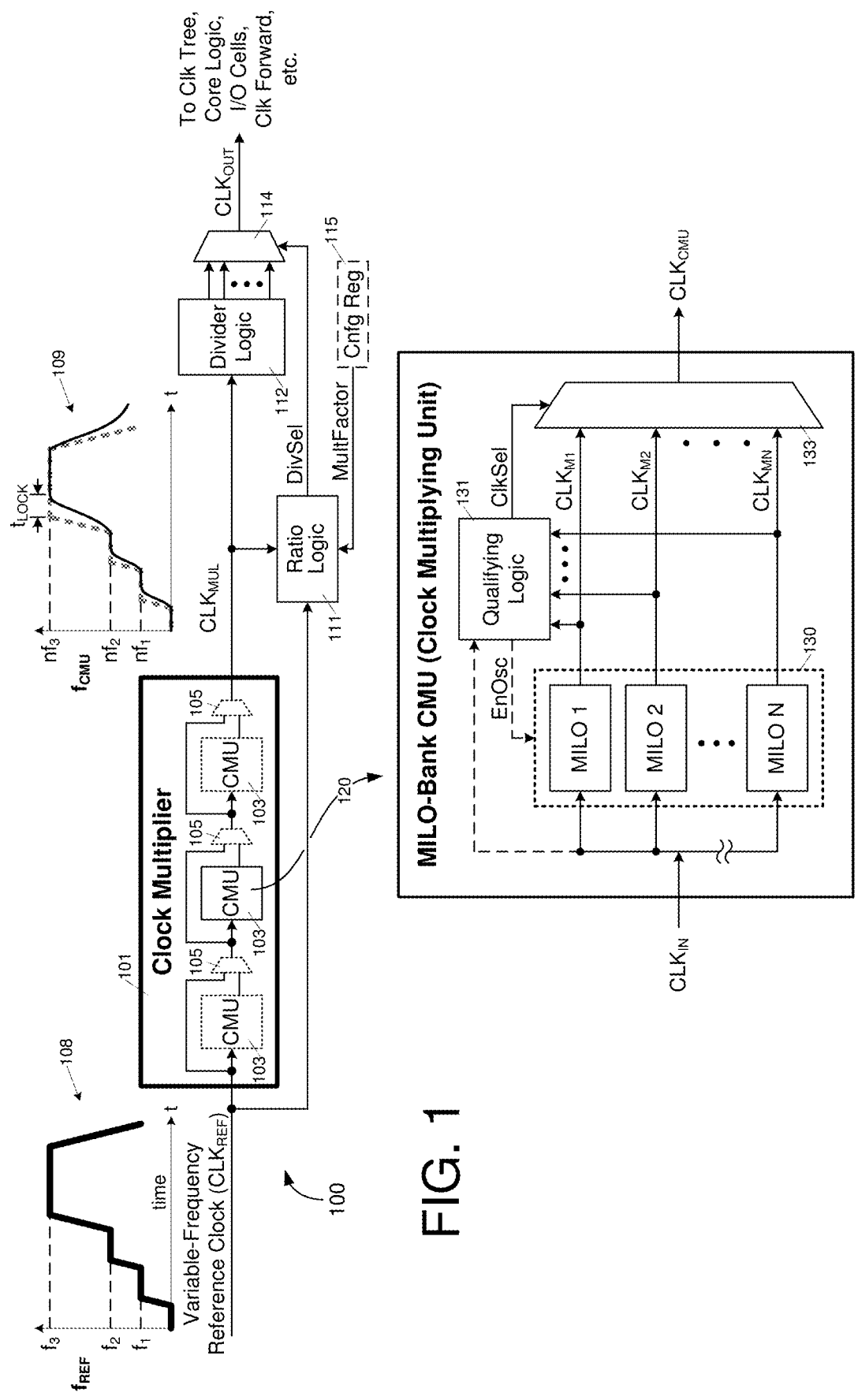
FIG. 1 illustrates an embodiment of a frequency-agile clock generator that yields a frequency-multiplied output clock in response to a variable-frequency reference clock.

FIG. 1 illustrates an embodiment of a frequency-agile clock generator 100 that yields a frequency-multiplied output clock ($CLK_{OUT}$) in response to a variable-frequency reference clock ($CLK_{REF}$). The clock generator includes a clock multiplier 101 having one or more clock multiplier units 103 (CMUs) coupled in stages to generate a frequency-multiplied clock ($CLK_{MUL}$). The clock generator also includes ratio logic 111, post-divider logic 112 and multiplexer 114 to control the selection of the finalized output clock in accordance with a register-programmed multiplication factor (e.g., "MultFactor" programmed within an optional configuration register 115. In the embodiment shown, the frequency multiplication effected by clock multiplier 101 is initially uncertain (i.e., in contrast to being predetermined), and instead the multiplication factor provided by the multiplier is determined by circuitry within the ratio logic 111 upon initial startup (or after each frequency shift) via a comparison of $CLK_{MUL}$ and $CLK_{REF}$. The multiplication factor thus determined is then compared with the programmed multiplication factor (MultFactor) to determine the clock-frequency division, if any, needed to yield the desired clock multiplication factor. Ratio logic 111 responsively generates a divisor-select signal (DivSel) to select a frequency-divided clock (including a no-division or unity-divisor selection). Operation of ratio logic 111 and divider logic 112 are discussed in further detail below.

As shown in FIG. 1, any of the one or more CMU stages 103 within clock multiplier 101 may be bypassed by respective bypass multiplexers 105, thus enabling a configurable number of stages and a configurable multiplication factor within clock multiplier 101. The CMU stages 103 may be uniformly implemented, tailored as necessary to meet respective input/output frequency ranges, or have entirely different architectures. In one embodiment, for example, a first stage CMU (i.e., coupled to receive the incoming reference clock) is implemented by the flexible-injection-rate clock multiplier (FCM) mentioned briefly above, while a second stage CMU is implemented by a multiple-ILO clock multiplier, with the net multiplication factor 'n' being the product of the multiplication factors achieved by the first and subsequent CMU stages. In other embodiments, more or fewer CMU stages may be provided with a commensurate effect on the net multiplication factor.

In general, the reference clock frequency (and thus the multiplied clock frequency) is increased or decreased according to the processing and/or signaling bandwidth needed within the host system. For example, the reference clock frequency may transition to higher frequencies to support active transmission/processing, and may transition to lower frequencies to conserve power when higher frequency operation is unnecessary. In the embodiment of FIG. 1, for instance, the incoming reference clock may be paused altogether (frequency=0) to effect a deep power-down mode within the host system (i.e., the system, device or apparatus in which clock generator 100 is deployed). Also, the breadth and granularity of the input frequency range may vary according to application needs, with such considerations driving the number and type of CMU stages 103 within clock multiplier 101. In a number of embodiments or operating modes presented herein, for example, reference clock frequency steps are constrained during fast-locking operations to binary multiples of a non-zero minimum, thus establishing a "binary-stepped" frequency transition profile. In other embodiments or operating modes, the reference clock frequency may be stepped incrementally (i.e., with a fixed minimum granularity) between starting and ending frequencies. In a number of cases, clock multiplier 101 generates a frequency-multiplied clock output ($CLK_{CMU}$) having frequency $f_{CMU}$ that is a constant or fixed multiple of the reference clock frequency. That is, as the reference clock frequency is stepped between frequencies f1, f2, f3 as shown at 108, the clock multiplier output transitions between output frequencies nf1, nf2, nf3 as shown at 109, with each transition incurring a lock time, $t_{LOCK}$, relative to the reference clock frequency shift. In other embodiments, discussed in further detail below, a fixed-frequency output clock is generated even as the input clock is binary-stepped across an input frequency range, thus effecting a different multiplication factor for each different reference clock frequency.

Still referring to FIG. 1, one or more of the CMU stages 103 within clock multiplier 101 can be implemented using a multiple-ILO embodiment as shown in detail view 120. More specifically, the input clock, $CLK_{IN}$ (which may be the reference clock, or a clock output from a prior CMU stage), is supplied in parallel to a number (N) of frequency-multiplying ILOs ("MILOs") within MILO bank 130, depicted as MILO 1, MILO2, . . . , MILO N. The MILOs generate respective frequency-multiplied output clocks, $CLK_{M1}$ . . . $CLK_{MN}$ (i.e., "MILO clocks"), which are supplied to qualifying logic 131 and to multiplexer 133. Qualifying logic 131 evaluates the clocks, identifying one of the MILO clocks as a preferred clock according to a predetermined or programmed qualifying criteria, outputting a corresponding clock select signal (ClkSel) to multiplexer 133 to select the preferred MILO clock to be the CMU output clock, $CLK_{CMU}$.

Figure 2A:
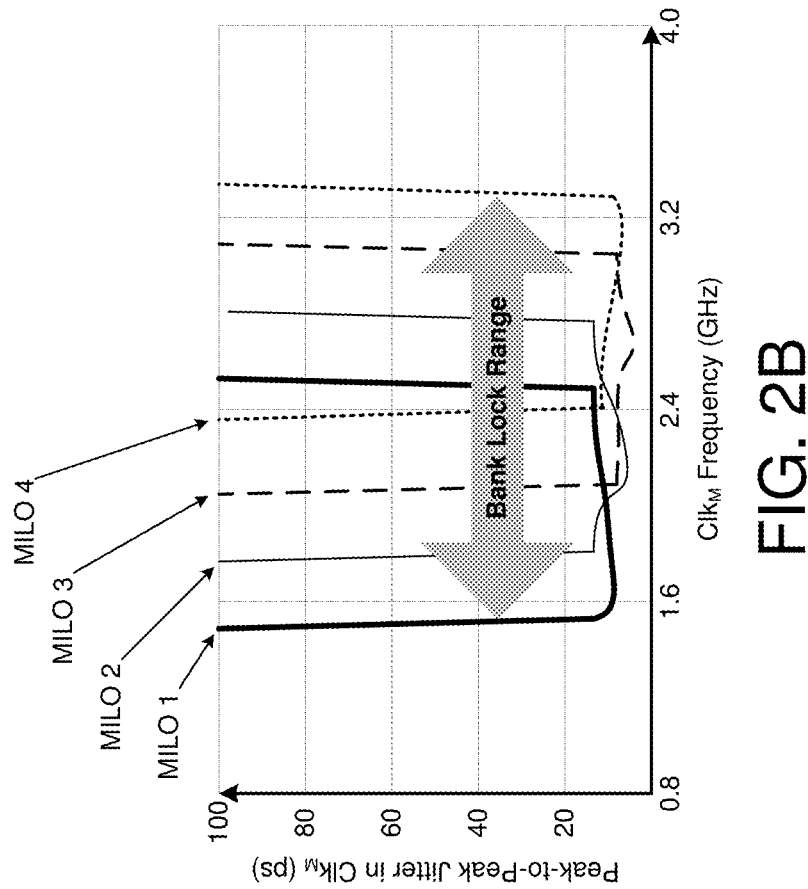
FIG. 2A illustrates an embodiment of a bank of multiplying injection-locked-oscillators (MILOs) that may be used to implement the MILO bank depicted in FIG. 1.

FIG. 2A illustrates an embodiment 134 of MILO bank 130 from FIG. 1. In the example shown, MILO bank 134 includes four MILOs $135_1$-$135_4$ coupled in parallel to receive the common incoming clock, $CLK_{IN}$. This number of MILOs is deemed sufficient in some applications and is carried forward in a number of exemplary embodiments disclosed herein. In all cases, the MILO banks shown/described may have more or fewer constituent MILOs, with commensurate changes in downstream circuitry (i.e., circuitry that receives the MILO bank output clocks), tuning circuitry, configuration circuitry, etc. In general the MILOs are configured to have overlapping operational frequency ranges. In one embodiment, for example, four MILOs can be implemented to collectively span approximately a 2:1 frequency range (e.g., at least a 1.5:1 frequency range). More generally, the number of MILOs and their respective configurations may be established through design and/or dynamic control to span a frequency range from a*fc to b*fc, where fc is the center frequency of the anticipated input clock frequency range, denotes multiplication, 'a' is a coefficient less than or equal to one, and 'b' is a coefficient greater than or equal to one.

Figure 2B:
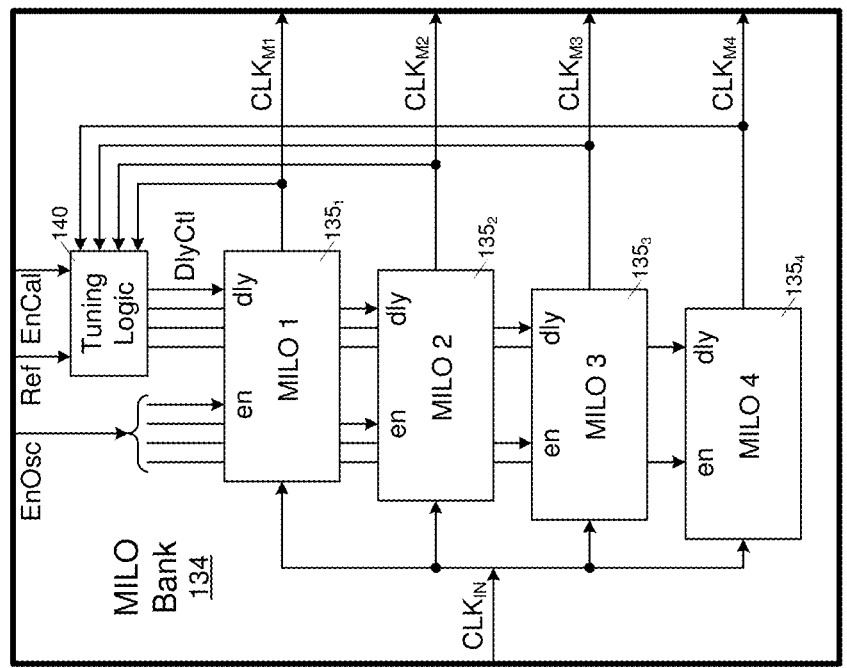
FIG. 2B illustrates exemplary spectrally-offset lock ranges corresponding to respective MILOs within the MILO bank of FIG. 2A.

Still referring to FIG. 2A, each of MILOs $135_1$-$135_4$ (collectively "135") has an enable input ("en") to receive a respective oscillator-enable (EnOsc) signal, and a delay input ("dly") to receive a respective delay control code (DCtl). A tuning logic circuit 140 is coupled to receive the MILO output clocks, $CLK_{M1}$-$CLK_{M4}$ (collectively, "$CLK_M$"). When enabled by a calibration-enable signal (EnCal), tuning logic circuit 140 tunes the natural frequencies of the MILOs 135 to achieve the spectrally offset (staggered) lock ranges shown, for example and without limitation, in FIG. 2B. That is, the natural frequency of MILO $135_1$ (MILO 1) is tuned to a first target frequency (roughly at the center of the U-shaped "MILO 1" lock range shown in FIG. 2B) and the natural frequencies of MILOs $135_2$-$135_4$ (MILOs 2-4) are tuned to progressively higher target frequencies, thereby yielding a collective "MILO bank" lock range substantially wider than the lock range of any of the individual MILOs. Because the bank lock range is a frequency multiple of the input clock frequency range, the MILO bank input frequency range is also substantially wider than the input frequency range of any of the individual MILOs. In the example shown in FIG. 2B, for instance, the overall output frequency range extends from approximately 1.6 GHz to 3.2 GHz, and thus over a 2:1 frequency range. Accordingly, where the MILO bank 134 effects a 4× frequency multiplication (input clock frequency multiplied by four to yield MILO clocks), the input clock frequency is permitted to range from 400 MHz to 800 MHz without loss of lock (i.e., at least one MILO being injection locked to the multiplied input clock frequency). In the case of 2× frequency multiplication, the input clock frequency may range from 800 MHz to 1.6 GHz without loss of lock. As a MILO's output frequency is determined by a combination of the input clock and the natural frequency setting, one interesting characteristic is that a MILO will lock to any integer sub-harmonic of its oscillation frequency. Further, in order to affect a multiplication ratio switch without changing the output frequency, only the input clock needs to be shifted and the MILO can remain locked. As discussed below, the individual MILOs 135 may be implemented by relatively small-footprint, fast-locking ring oscillators and pulse-injection logic. Further, after a given one of MILOs 135 is selected to source the CMU output clock, the other "non-selected" MILOs may be disabled (e.g., by deasserting respective enable signals) to save power. The net result is a low-power, fast-locking clock multiplier with relatively broad input range and small area footprint and thus a clock multiplier having characteristics desired in a frequency-agile clock generator.

FIGS. 3A and 3B illustrate an embodiment and exemplary operation of a multiplying, injection-locked oscillator (MILO) 160 that may be used to implement any or all of the MILOs 135 shown in FIG. 2A. As shown, MILO 160 includes a pair of pulse generator stages 161 and 165, pulse injector 171, and a pair of ring oscillator stages 173 and 175. The incoming clock signal, $CLK_{IN}$, is supplied to first-stage pulse generator 161 which includes pulse-generating logic (e.g., XOR gate 163 and delay element 164) to generate a pulse, thus including rising and falling output signal transitions, in response to each transition of the input clock. The result of this operation is shown in FIG. 3B (i.e., for a differential implementation), demonstrating the doubling of the number of timing edges generated by the first-stage pulse generator relative the incoming clock signal. As shown, the width of each pulse generated by the pulse generator (T1) may not exactly equal half the time between successive input clock edges, and therefore may not equal the time between pulses (T2). This "duty cycle imbalance" in the output pulse waveform (i.e., non-uniform pulse widths) may be corrected to some degree by adjusting the delay applied within delay element 164. Other duty cycle correction techniques and circuitry may also be employed to further equalize (or at least reduce the difference between) times T1 and T2. Also, while ring oscillators are depicted in the embodiment of FIG. 3A and other embodiments described below, in all such cases alternative oscillator circuits such as LC (inductor-capacitor) oscillators may be employed instead of or in combination with ring oscillators.

Still referring to FIGS. 3A and 3B, the pulse stream output from first-stage pulse-generator 161 is supplied to second-stage pulse-generator 165 which also includes pulse-generating logic (XOR gate 167 and delay element 168) to double the number of timing edges. As discussed above, this edge-doubling operation yields a pulse (two edges) in the output pulse stream delivered to pulse injector 171 in response to each edge in the input pulse stream (from first-stage pulse generator 161) as shown in FIG. 3B, and thus four edges for each edge in the input clock signal. As with the first-stage pulse generator, the duty-cycle imbalance imparted by the second-stage pulse generator may be mitigated by adjusting the propagation delay through delay element 168, and/or additional duty cycle correction circuitry.

In one embodiment, pulse injector 171 includes a delay line formed by a sequence of delay elements, D1-D4, tuned to have delays corresponding to delays of counterpart delay elements, R11-R14 and R21-R24, within the first and second ring oscillator stages, 173 and 175, respectively. Thus, the propagation delay through any of the pulse-injector delay elements (D1-D4), a time interval referred to herein as a "unit-delay," approximately matches the propagation delay through any of the ring-oscillator delay elements (R11-R14 and R21-R24) within the first and second ring oscillator stages. Consequently, by selecting the output of each delay element within pulse injector 171 as the injection pulse source for a corresponding delay element within first ring oscillator stage 173, the injection pulses will be applied within the ring oscillator in cascading fashion, with each delay element of ring oscillator 173 receiving an injected pulse a unit-delay later than the preceding delay element in the ring and thus at approximately the same phase offset with respect to the desired frequency of the clock signal output by ring oscillator 173. In the particular embodiment shown, the natural frequency of ring oscillators 173 and 175 is tuned to be approximately four times the frequency of the input clock signal so that the injected pulse stream has a pulse frequency within the injection-locking range of the first and second stage ring oscillators 173, 175. That is, the injected pulses effect small but regular phase corrections (correcting for a difference between the ring oscillator's natural frequency and a multiplied-by-4 input clock frequency) so that the output frequency of the first-stage ring oscillator locks 173 to the injection pulse frequency (i.e., is "injection-locked") and thus to a 4× multiple of the input clock frequency.

As shown in FIG. 3B, the corrections effected by the injection-locking pulses produce a repeatable variation in the pulse widths of the clock output by the first-stage ring oscillator 173. That is, a pulse having a relatively wide duration (T3) is followed by a pair of pulses having intermediate durations (T4 and T5) and then by a pulse having a relatively short duration (T6). In the embodiment of FIG. 3A, this jitter (i.e., edge-to-edge timing variation or jitter) in the clock output by the first-stage ring oscillator 173 is mitigated (filtered, in effect) by applying the outputs of the first-stage ring oscillator delay elements as injection pulses into the second-stage ring oscillator 175, thus yielding the reduced-jitter MILO output clock ($CLK_M$) shown in FIG. 3B. Also, given the deterministic nature of the jitter (e.g., short pulse occurring after every Nth edge, and wide pulse occurring after every short pulse), edge multiplexing techniques may be used to replace early or late edges with less early/less late edges, thereby further mitigating the jitter. Also, one or more additional ring oscillator stages and/or duty cycle correction circuitry may be provided to further reduce deterministic jitter.

FIG. 3C illustrates an embodiment of a ring oscillator 180 that may be used to implement either or both of the ring oscillator stages (173, 175) depicted in FIG. 3A. As in FIG. 3A, ring oscillator 180 includes four delay elements, Rn1-Rn4, though more or fewer delay stages may be provided in alternative embodiments. Each of the delay elements receives a differential input and, after a finite (and tune-able) propagation delay, outputs an inverted instance of the differential input. To establish an odd number of inversions from the output of a given delay element to its input (and thus effect oscillation of the ring), the differential output of the final delay element (Rn4) is twisted with respect to its input to the first delay element (Rn1), a twist that may be omitted, for example, in an implementation having an odd number of inverting delay elements. As shown, the differential outputs of individual delay elements may be supplied as injection signals to a subsequent ring-oscillator stage, and incoming injection signals are supplied to respective delay elements. An analog or digital delay control signal is supplied to each of the delay elements within ring oscillator 180 (and, as shown in FIG. 3A, to each of the delay elements within pulse-injector 171) to enable tuning/calibration of a single unit-delay, and thus the natural frequency of the ring-oscillator.

FIG. 3D illustrates one possible embodiment of a delay element, "Rnn," that may be used to implement any of the delay elements within the ring oscillators of FIGS. 3A and 3C, and/or within the pulse injector of FIG. 3A. As shown, differential input signals $S_{IN}+/S_{IN}-$ are supplied to control nodes (e.g., gate terminals in a field-effect transistor (FET) implementation) of input transistors 192a and 192b, each of which is coupled in series between a resistive pull-up element (R, pulled up to $V_{DD}$ in the example shown) and a common current source 193. By this arrangement, when $S_{IN}+$ is high and $S_{IN}-$ is low, input transistor 192a is switched on (i.e., to a conducting state) and input transistor 192b is switched off (i.e., to a non-conducting or negligibly-conducting state) so that the current drawn by current source 193 (implemented, for example, by a bias-signal-controlled transistor as shown), flows predominantly through transistor 192a, drawing the voltage at output node $S_{OUT}-$ low while the voltage at node $S_{OUT}+$ is pulled high and thus yielding an inverted differential output. When the input state reverses, $S_{IN}+$ transitioning from high to low and $S_{IN}-$ transitioning from low to high, the differential output is similarly switched, with $S_{OUT}+$ going high and $S_{OUT}-$ going low. The net propagation delay through the delay element may be controlled by adjusting the resistance of resistive load elements (and/or the capacitance of capacitive load elements coupled to the output nodes, not shown) in response to a delay control signal (DlyCtl). Also, in the embodiment shown, an injection port is provided by injection transistors 194a and 194b, each of which is coupled in series between a respective one of the resistive load elements (R) and an injection current source 195 (formed, in this example, by an injection-bias-controlled transistor). In this configuration, injection signals Inj+ and Inj− are effectively wire-ORed with the delay-element inputs, $S_{IN}+$ and $S_{IN}−$, and thus may advance or retard (delay) the time at which the differential amplifier is switched between positive and negative output states, thereby increasing or reducing the net propagation delay through the delay element stage and thus the ring oscillator as a whole. When deployed as a delay element within pulse injector 171 of FIG. 3A, the inputs to the injection port may be tied low, thereby replicating the overall structure for delay matching between the delay element and pulse-injector elements, but preventing unwanted signal injection.

Various changes may be made to the delay element of FIG. 3D in alternative embodiments including, without limitation, changes in the manner of adjusting the delay element, the implementation of the injection port, the bias current controls and so forth. Also, while a current-mode logic (CML) implementation is shown, the delay elements within the pulse injector and/or ring oscillators may alternatively be implemented by respective pairs of CMOS (complementary metal-oxide-semiconductor) inverters having propagation delays controlled, for example, by adjusting the inverter supply voltage. Alternate embodiments for the design of delay elements and injection blocks may include, for example and without limitation, CMOS inverters, differential sense-amp structures, regulated elements, CVSL or DCVSL elements and others.

FIG. 3E illustrates an exemplary tuning operation that may be executed to adjust the natural frequency of the MILO shown in FIG. 3A (or the MILOs shown in FIG. 1 or 2A). Initially, at 221, injection-locking is disabled within the ring oscillator stages to enable the MILO to oscillate at its natural frequency—the frequency established by the cumulative delays through the delay elements of either of the ring oscillators (which should be nominally the same) without injection. In the CML embodiment of FIG. 3D, for example, injection may be disabled by gating injection signals Inj+ and Inj− (e.g., forcing the inputs to the injection port low while a calibrate-enable signal shown in FIG. 2A is asserted), though the injection current source may alternatively or additionally be switched off. At 223, after injection is disabled, edges or cycles of the MILO clock ($CLK_M$) are counted over a predetermined number of $CLK_{IN}$ cycles (or over a predetermined number of cycles of an alternative clock, shown as "Ref" in FIG. 2A) to determine a measure of the frequency ratio between $CLK_{IN}$ and the MILO output clock, $CLK_M$. This count provides an indication of the approximate frequency difference between the natural frequency of the MILO and a frequency-multiplied instance of $CLK_{IN}$). At 225, the count value (or measure of the frequency ratio) is used to index a lookup table or applied in a calculation to determine the approximate delay-element adjustment, $DC_{IC}$, required to establish the natural frequency of the MILO at a desired point within the spectral range spanned by the overall bank of MILOs. For example, when tuning MILO 1 of FIG. 2A to establish the lock range shown in FIG. 2B, a first delay-element correction is determined at 225 and applied at 227 in accordance with the difference between the natural MILO frequency corresponding to the desired lock range and the natural MILO frequency indicated by the frequency measurement. When tuning MILO 2, a second delay-element correction is determined at 225 applied at 227 to tune (or shift or adjust) the natural frequency of MILO 2 to approximately the MILO frequency corresponding to the desired MILO 2 lock range (i.e., a different target frequency than that of MILO 1). This is repeated for the remaining MILOs. After respective delay control settings have been applied at 227 to tune the natural frequencies of the MILOs to their target values, operations that may be executed concurrently for all MILOs or sequentially (MILO after MILO), the calibration-enable signal is deasserted at 229 to enable or re-enable pulse injection and thus enable or re-enable injection locking within the MILO bank.

Reflecting on FIGS. 3A-3E, it should be noted that various frequency-multiplication ratios other than that shown may be achieved, including a unity multiplication ratio (i.e., output clock frequency matches or nominally matches input clock frequency). In one embodiment, for example, the number of pulse-generator circuits (161, 165) coupled between the input clock source and pulse injector 171 may be varied (e.g., bypassing one or more of the pulse generators) according to a register setting or other control to establish the desired number of edge doubling operations, if any. In such an embodiment, the delay elements (e.g., 164, 168) within the pulse generators may be adjusted in calibration operations or according to predetermined settings to mitigate duty cycle distortion in the pulse generator output.

Figure 4:
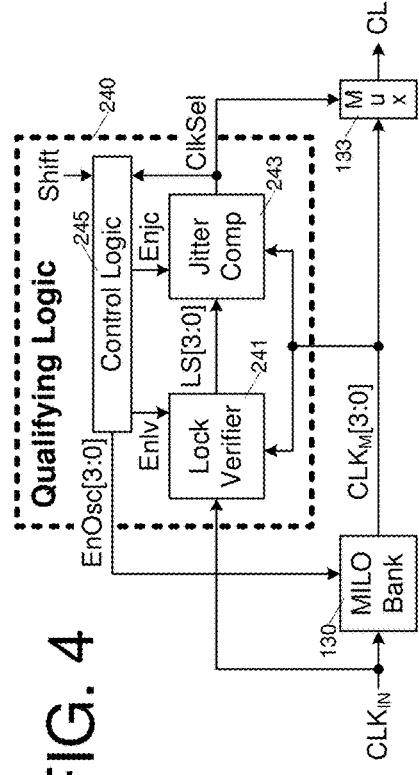
FIG. 4 illustrates an embodiment of a qualifying logic circuit that may be used to implement the qualifying logic shown in FIG. 1.

FIG. 4 illustrates an embodiment of a qualifying logic circuit 240 that may be used to implement qualifying logic 131 of FIG. 1. In the embodiment shown, qualifying logic 240 includes separate functional circuits, including lock verifier 241 and jitter comparator 243, for qualifying the frequency and jitter of the clocks ($CLK_M[3:0]$) generated by a MILO bank 130. Control logic 245 is provided to control the timing of lock verification and jitter comparison operations and also to disable and enable individual MILOs within the MILO bank at appropriate times relative to assertion of a frequency-change signal, "Shift." In one embodiment, the control logic responds to assertion of the frequency-change signal (e.g., at system startup, or after a 'power-up' command or whenever a reference clock frequency shift is detected) by enabling all MILOs and shortly thereafter outputting a lock-verify-enable signal ("Enlv") to lock verifier 241 to enable frequency-lock verification therein. The control logic also outputs a jitter-compare-enable signal ("Enjc") to jitter comparator 243 (e.g., concurrently or shortly after enabling frequency-lock verification) to trigger a jitter comparison operation with respect to the MILO clocks.

Figure 5A:
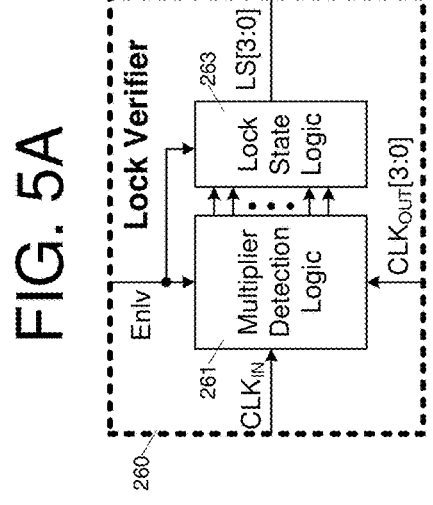
FIG. 5A illustrates an embodiment of a lock verifier circuit that may be used to implement the lock verifier of FIG. 4.

FIG. 5A illustrates an embodiment of a lock verifier circuit 260 that may be used to implement the lock verifier 241 of FIG. 4. In general, lock verifier 260 determines, for each MILO clock signal output by the MILO bank ($CLK_M[3:0]$), whether the MILO clock is locked to a frequency multiple of the input clock (i.e., whether the clock-sourcing MILO is injection-locked to $CLK_{IN}$) and, if so, the frequency multiplier effected within the sourcing MILO. As the MILOs within the sourcing MILO bank have been tuned to overlapping, but non-uniform lock ranges, different groups or subsets of the MILOs may injection lock to the input clock as the input clock is transitioned to different frequencies corresponding to the bank lock range. This includes a subset of only one MILO when the input frequency corresponds to the upper or lower extreme of the bank lock range. Further, because each MILO may lock to different sub-harmonic pulse rates, the multiplication effected by a given one of the injection-locked MILOs is initially unknown and may vary from MILO to MILO, and it is possible that two different MILOs in the MILO bank will both lock to the input clock, one with an output frequency that is a 2× multiple of the other. Accordingly, in lock verifier 260, multiplier detection logic 261 is provided to determine both MILO output characteristics: whether the MILO clock is locked to an integer-multiple frequency of the input clock and, if so, the multiplication factor effected. The outputs of multiplier detection logic 260 are supplied to lock-state logic 263 which, in turn, generates a set of lock-state signals (LS[3:0]), each corresponding to a respective MILO clock and indicating whether the MILO clock is frequency-locked to a desired or specified integer multiple of the input frequency.

Figure 5B:
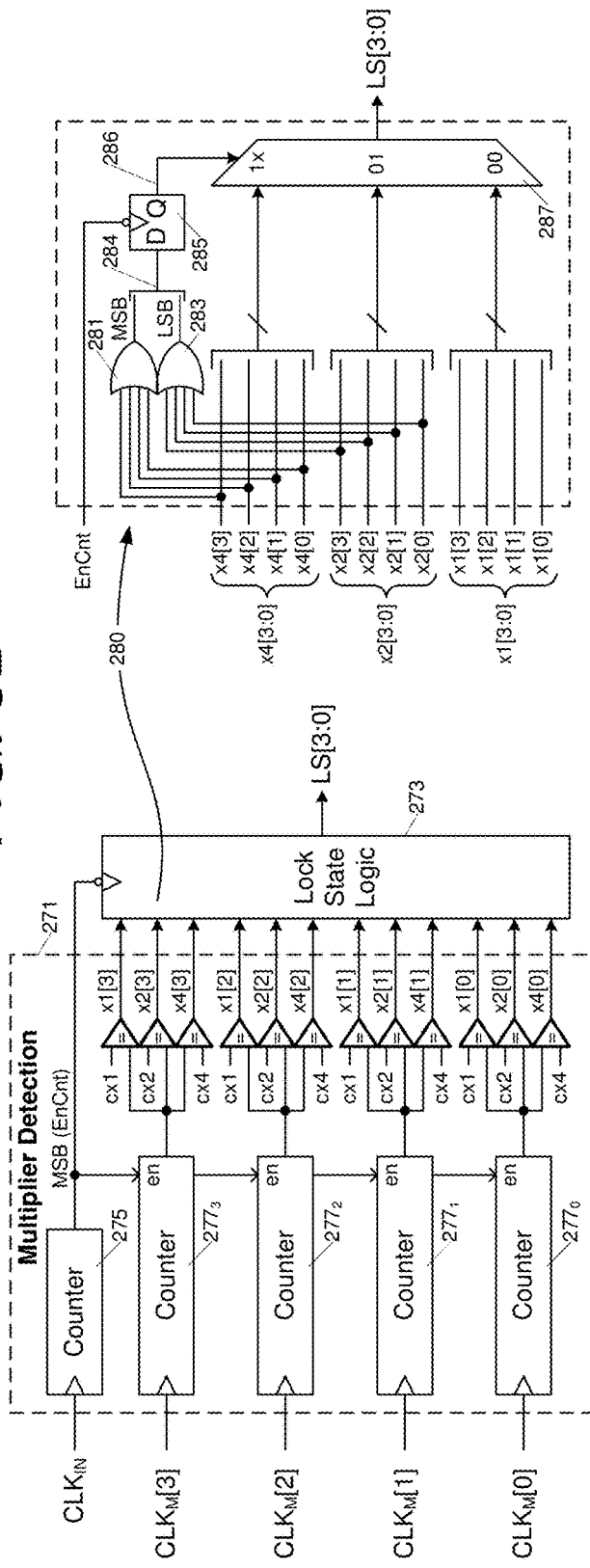
FIG. 5B illustrates embodiments of a multiplier detection circuit and lock-state logic circuit that may be used to implement like-named logic circuits within the lock verifier of FIG. 5A.

FIG. 5B illustrates embodiments of a multiplier detection circuit 271 and lock-state logic circuit 273 that may be used to implement like-named logic circuits within the lock verifier of FIG. 5A. Multiplier detection circuit 271 includes an input-clock counter 275 and a set of four MILO-clock counters $277_0$-$277_3$, one for each of the MILOs within the MILO bank of FIG. 2A. In the embodiment shown, input-clock counter 275 counts cycles of the input clock signal, outputting the most-significant bit (MSB) of the count value as a count-enable signal (EnCnt) to the MILO-clock counters, thereby enabling the MILO-clock counters to count cycles of respective MILO clocks (CLKM[3:0]) over a predetermined number of cycles of the input clock. In one implementation, for example, the count-enable interval or "evaluation period" is set by a two-bit input counter 275 (modulo 4 counter) that asserts the count-enable signal for a total of two input clock cycles. Accordingly, if a given MILO clock is locked to four times (4×) the frequency of the input clock, sixteen MILO clock edges, or 8 MILO-clock cycles will be counted by a respective one of MILO-clock counters $277_0$-$277_3$ during the evaluation period. If a MILO clock is locked to twice (2×) the frequency of the input clock, 8 MILO-clock edges or 4 MILO-clock cycles will be counted, and if the MILO clock is locked to the frequency of the input clock, 4 MILO-clock edges or 2 MILO-clock cycles will be counted. The outputs of the MILO-clock counters $277_0$-$277_3$ are supplied to respective sets of three comparators that test the count outputs for equality with the edge or cycle counts expected for ×4, ×2 and ×1 locking, raising or lowering an equality signal for each comparison (thereby generating equality signals ×1[i], ×2[i] and ×4[i], where 'i' is the MILO index and ranges, in this example, from 0 to 3). Accordingly, at the conclusion of the evaluation period (i.e., marked by deassertion of the count-enable signal), the equality signals for each MILO (×1[i], ×2[i], ×4[i]) indicate whether the MILO clock is injection-locked to a ×4, ×2 or ×1 multiple of the input clock frequency. Additional or different injection locking ratios may be evaluated by the multiplier detection logic in alternative embodiments, and multiple evaluation periods may be used to assess frequency locking and multiplication factor, rather than a single evaluation period.

The equality signals and count-enable signal are supplied to lock-state logic 273, an embodiment of which is shown in detail view 280. As shown, the incoming equality signals may be organized (logically and/or physically) according to the respective multiplication factor, with the ×1 equality signals (×1[3:0]), ×2 equality signals (×2[3:0]), and ×4 equality signals (×4[3:0]) being supplied to respective input ports of multiplexer 287. Logic OR gates 281 and 283 are coupled to receive the ×4 equality signals and ×2 equality signals, respectively, and generate a most-significant bit (MSB) and least-significant bit (LSB) of a lock-state select signal 284. By this arrangement, if any of the MILO clocks is injection locked to a frequency four-times the input clock frequency, the MSB of the lock-state select signal will be raised (and conversely, if no ×4 equality signals are asserted, the MSB will be lowered), and if any of the MILO clocks is injection-locked to twice the input clock frequency, the LSB of the lock-state-select signal will be raised. The lock-state-select signal is latched within lock-state sample register 285 in response to the falling edge of the enable-count signal (i.e., EnCnt from input clock counter 275) and thus at the end of the evaluation period (note that additional delay may be provided between the close of the evaluation period and the latching operation within register to provide time for the lock-state-select signal to settle following the close of the evaluation period). The latched lock-state-select signal 286 is supplied to a control input of multiplexer 287 to select one of the three sets of equality signals, ×4, ×2 or ×1 to be output as the lock-state select signals. In the embodiment shown, multiplexer 287 is configured to output the ×4 equality signals (×4[3:0]) as the lock-state output, LS[3:0], if any of the ×4 equality signals are asserted (i.e., if any of the MILO clocks is injection locked to a 4× multiple of the input clock frequency), and to select the ×2 equality signals (×2[3:0]) as the lock-state output if any of the ×2 equality signals are asserted (i.e., if any of the MILO clocks is injection-locked to a 2× multiple of the input clock frequency). If none of the MILO outputs are injection locked at the 4× or 2× frequency multiples, then multiplexer 287 outputs the ×1 equality signals as the lock-state output. Accordingly, the lock-state logic shown at 280 favors higher multiplication factors, setting the lock-state according to the highest injection-locked multiple of the input clock frequency detected by multiplier detection logic 271. Various other lock-state determination policies may be implemented in alternative embodiments, including an implementation that chooses the lock-state multiple according to a statistical model based on the injection-locked multiples. For example, if two MILO banks are injection locked at a ×2 frequency multiple and one is injection locked at a ×4 frequency multiple, the ×2 equality signals may be selected as the lock-state output.

In an alternative embodiment, lock verifier 241 may yield an affirmative frequency-lock determination for clocks at different frequency multiples (e.g., one MILO clock locked at input frequency ×4 and another locked at input frequency ×2). In such an embodiment, so long as the frequency of a given MILO clock output is high enough to meet the target multiplication factor of the overall system (e.g., the programmed multiplier described in reference to FIG. 1), then that clock output is a viable candidate for selection as the final output clock. Thus, in a circumstance where MILO4 yields a 4× clock (post-divided by 2 to yield the final output clock) and MILO1 yields a 2× clock (which may be selected without division as the final output clock), then both those clocks may be deemed to be in a frequency-locked state. Accordingly, lock verifier 241 may include circuitry to identify non-uniform lock frequencies and to account for the net clock multiplier required within the system, disqualifying MILO clocks that don't meet the net multiplier requirement. Starting from the assumption that locking at a lower multiplication factor generally yields a less jittery clock, another lock verifier embodiment identifies the lowest multiplication factor at which any one of the MILO clocks is frequency locked (i.e., at or above a minimum multiplication factor required by the system) and then sets the lock status for all MILOs according to whether their outputs are frequency locked at that multiplication factor. These and other lock verifier embodiments and operating modes, including the ability to programmably select between different lock verification modes according to application demands and/or instantaneous conditions, may employed within lock verifier 241.

FIGS. 6A-6F relate to embodiments of jitter comparator circuitry that may be used to determine which of a number of frequency-locked MILO clocks exhibits the lowest cycle-to-cycle jitter. Given the general MILO characteristic of having higher deterministic jitter near the point of losing lock, a comparison of adjacent-cycle deterministic jitter can be used to determine, given a set of locked MILOs, which of the MILOs is operating with the most margin. FIG. 6A illustrates an embodiment of a jitter comparator 295 that may be used to implement the jitter comparator within the qualifying logic of FIG. 4. As shown, jitter comparator 295 includes four jitter detectors $297_1$-$297_4$ and an inter-clock jitter comparator 299. Each of the jitter detectors receives a respective one of MILO clocks $CLK_M$[3:0] and a corresponding one of lock-state signals LS[3:0] and generates a measure of the deterministic jitter, DJ, for the incoming MILO clock. The inter-clock jitter comparator 299 compares the relative magnitudes of the different deterministic jitter measurements, DJ[3:0], generated by the jitter detectors and outputs a clock select signal, ClkSel, corresponding to the MILO clock deemed to exhibit the minimum deterministic jitter.

As shown in FIG. 6B, due to the periodic phase-correction in the MILO embodiment described above, the deterministic (or repeatable as opposed to random) jitter in the MILO output tends to have a unique signature, with the narrowest pulse immediately preceding the widest (or vice-versa) and occurring in the MILO output at twice the input clock frequency (i.e., at the edge rate of the input clock). In the particular example shown, the MILO clock oscillates at four times the frequency of the input clock so that the short-pulse, long-pulse sequence (and thus the worst-case deterministic clock jitter) occurs once every two cycles of the MILO clock. Accordingly, in one jitter-detector embodiment, shown in FIG. 6C, a set of integrators 312a-312d are provided to measure the difference between back-to-back (temporally adjacent) pulses for each of four two-pulse intervals that repeat every two cycles of the MILO clock. More specifically, numbering the two-pulse intervals $T_{12}$, $T_{23}$, $T_{34}$ and $T_{41}$ and numbering successive clock pulses 1-5 as shown in FIG. 6D, integrator 312a ("Integrator12") generates a voltage $VJ_{12}$ corresponding to the clock jitter between pulses 1 and 2 by integrating a signal over interval $T_{12}$, differentially charging/discharging a capacitive element during pulse 1 and reversing the charging/discharging operation during pulse 2. By this operation, the magnitude of any residual voltage on the capacitive element (or elements) at the conclusion of pulse 2 is indicative of a difference between the charge/discharge intervals and thus is indicative of the difference between the widths of pulses 1 and 2. Accordingly, the residual voltage may be latched (e.g., sampled and held) and output by integrator 312a as the measure of deterministic jitter, $VJ_{12}$, for period $T_{12}$. Similarly, integrator 312b generates clock jitter measurement $VJ_{23}$ over interval $T_{23}$ to signal the pulse width difference between pulses 2 and 3, integrator 312c generates clock jitter measurement $VJ_{34}$ over interval $T_{34}$ to signal the pulse width difference between pulses 3 and 4, and finally integrator 312d generates clock jitter measurement $VJ_{41}$ over interval $T_{41}$ to signal the pulse width difference between pulses 4 and 5, and thus over the final two-pulse interval spanned (i.e., at least partly) by two MILO clock cycles. The voltage measurements may be repeated over a number of two-cycle intervals, optionally starting with the residual voltage from the prior two-cycle interval to accumulate (and average) multiple jitter measurements for each two-pulse interval. In any case, after a predetermined number of two-cycle intervals have transpired, the clock jitter measurements ($VJ_{12}$, $VJ_{23}$, $VJ_{34}$ and $VJ_{41}$) may be compared with one another within cycle-to-cycle jitter comparator 315 to determine which two-pulse interval exhibits the largest (worst) clock jitter, and thus the maximum deterministic jitter of the MILO clock. It is worth noting that, in the embodiment shown, no direct knowledge of the mapping function of jitter to accumulated integrator output voltage is required. That is, as the integrator output voltage enables a relative comparison of two different clocks, knowledge of the absolute jitter in picoseconds is not required—only that one clock is preferred over another.

In one embodiment, each jitter detector 310 includes a finite state machine 311 (FSM) that enables an integration operation within each of integrators 312a-312d in succession. Referring to the exemplary state diagram shown detail view 325, the state machine remains in an idle state ("idle") with all integrator-enable signals (en12, en23, en34, en41) deasserted until the enable jitter-compare signal (enjc) is raised and thereafter transitions from the idle state to states s1 through s5 in response to successive edges of the incoming MILO clock. Within states s1-s5, which correspond respectively to the numbered pulses 1-5 shown in FIG. 6D, integrator-enable signals are asserted in successive combinations to enable each of the integrators to integrate the incoming MILO clock over a respective one of intervals $T_{12}$, $T_{23}$, $T_{34}$ and $T_{41}$. Thus, during state s1, enable signal en12 is asserted to enable integration within integrator 312a during the first pulse that constitutes interval $T_{12}$. During ensuing state, s2, enable signal en12 remains asserted to enable integration within integrator 312a during the second pulse that constitutes interval $T_{12}$, and enable signal en23 is concurrently asserted to enable integration within integrator 312b during the first portion of interval $T_{23}$. Upon transitioning to state s3 (i.e., at the falling edge of the MILO clock that concludes pulse 2), en12 is deasserted to terminate integration within integrator 312a, while enable signal en23 remains asserted to enable integration within integrator 312b during the second portion of interval $T_{23}$, and enable signal en34 is asserted to enable integration within integrator 312c during the first portion of internal $T_{34}$. Similarly, upon transitioning to state s4, en23 is deasserted to terminate integration within integrator 312b, while enable signal en34 remains asserted to enable integration within integrator 312c during the second portion of interval $T_{34}$, and enable signal en41 is asserted to enable integration within integrator 312d during the first portion of interval $T_{41}$. Upon transitioning to state s5, en34 is deasserted to terminate integration within integrator 312c, while enable signal en41 remains asserted to enable integration within integrator 312d during the second portion of interval $T_{41}$. Finally, at the rising edge of the MILO clock that marks the end of pulse 5, state machine 311 deasserts en41 to terminate integration within integrator 312d, and returns to the idle state.

In one embodiment, shown in FIG. 6E, each of the integrators includes a matched pair of current sources 341 and 343 (though a single current source may alternatively be used) switchably coupled between a capacitive element 347 and respective supply voltage nodes ($V_{DD}$ and ground in this example), and a sample-and-hold circuit 351 coupled to the capacitive element 347 through switch element 348. When the integrator-enable signal for the integrator (enxx) is deasserted, the output node of the capacitive element 347 (i.e., the node coupled to switch element 348) is coupled to ground through switch element 349 (e.g., a FET or other signal-controlled switching device), and when the integrator-enable signal is asserted, switch element 349 is opened and switch element 348 is closed to enable the capacitive element to be charged and discharged during successive pulses of a given integration interval. That is, capacitive element 347 is charged by current source 341 via switch element 342 during the high phase of the MILO clock and discharged by current source 343 via switch element 344 during the low phase of the MILO clock (the high and low clock phases occurring in either order), thereby yielding a residual voltage at the conclusion of the integration interval that corresponds to the pulse-width difference between successive low and high (or high and low) pulses of the MILO clock. When the integrator-enable signal transitions from high to low, marking the end of the integration interval, the sample-and-hold signal samples the capacitor voltage (there may be some delay with respect to the opening of switch 348 and closing of switch 349 to avoid a race with the sample-and-hold operation) and holds the sampled value as the integrator output, $VJ_{XX}$. Thus, after the state machine 311 of FIG. 6C transitions from state s5 back to the idle state, the outputs of integrators 312a-312d constitute the deterministic jitter measurements, $VJ_{12}$-$VJ_{41}$ as shown.

FIG. 6F illustrates an embodiment of an inter-cycle jitter comparator 360 that may be used to implement cycle-to-cycle jitter comparator 315 of FIG. 6C. Inter-cycle jitter comparator 360 includes a set of magnitude generators 362 ("abs"), voltage comparators 363 and combinatorial logic 365. Each of the magnitude generators 362 produces an absolute-value measure of a respective incoming deterministic jitter voltage, referred to herein as a jitter magnitude (i.e., $|VJ_{12}|$, $|VJ_{23}|$, $|VJ_{34}|$ and $|VJ_{41}|$). In an analog embodiment, for example, each magnitude generator 362 includes a zero-comparator to compare a differential incoming voltage against a null voltage (differential inputs tied together) and switching circuitry to invert the coupling of the magnitude generator's input nodes and output nodes (i.e., coupling In+ to Out−, and In− to Out+) if the zero-comparator indicates that the incoming jitter voltage is negative, and to couple the input nodes to the output nodes without inversion otherwise. In a digital embodiment, the magnitude generator may include logic or even passive circuitry to convert the digital jitter voltage to an absolute value (e.g., by omitting the sign bit in a two's complement representation). In an alternative embodiment, a larger set of comparators may be provided to enable comparison amongst true and complementary values to determine the largest jitter magnitude. Voltage comparators 363 compare the four incoming jitter voltage measurements, generating logical outputs according to which jitter magnitude is higher than the other, and combinatorial logic circuit 365 generates a select signal (Sel) corresponding to the maximum jitter magnitude logically determined based on the voltage comparator outputs. The select signal is supplied to multiplexer 369 to select the maximum of jitter magnitudes $|VJ_{12}|$, $|VJ_{23}|$, $|VJ_{34}|$ and $|VJ_{41}|$ to be output as the measure of deterministic jitter, DJ[i], for a given jitter detector 'i'. Thus, the different MILOs from the MILO bank will have their individual worst-case jitter compared within one another in a set of Boolean operations, with the best worst-case jitter measure used to select the particular signal to be output.

Figure 7:
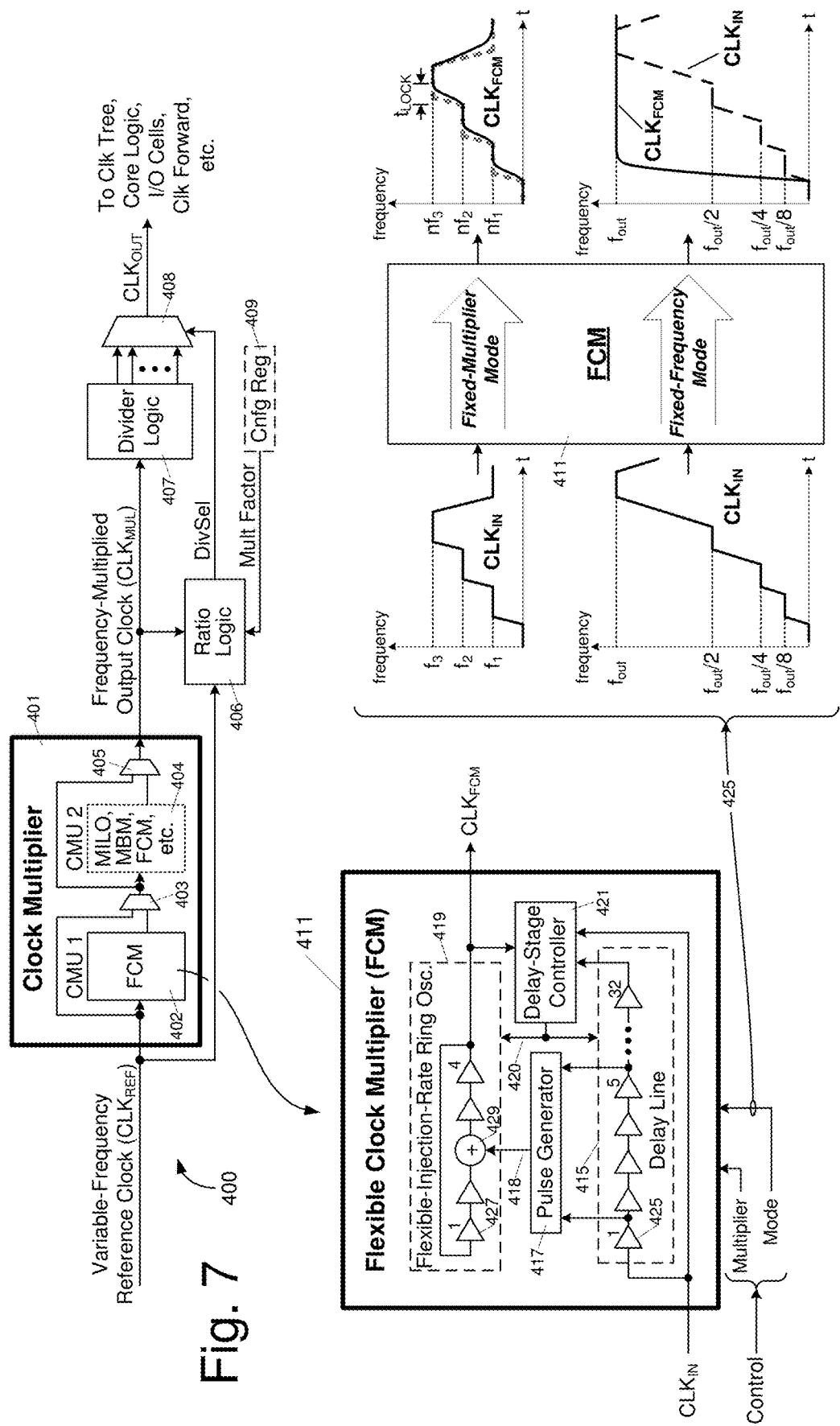
FIG. 7 illustrates an alternative embodiment of a frequency-agile clock generator that yields a frequency-multiplied output clock in response to a variable-frequency reference clock.

FIG. 7 illustrates an alternative embodiment of a frequency-agile clock generator 400 that yields a frequency-multiplied output clock ($CLK_{OUT}$) in response to a variable-frequency reference clock ($CLK_{REF}$). As in the embodiment of FIG. 1, the clock generator includes a clock multiplier 401 having one or more clock multiplier units 402, 404 (CMUs) coupled in stages to generate a frequency-multiplied clock ($CLK_{MUL}$). Clock generator 400 also includes ratio logic 406, divider logic 407 and multiplexer 408 to control the selection of the finalized output clock in accordance with a register-programmed multiplication factor. As above, depending on the number and type of CMU stages, the frequency multiplication effected by the clock multiplier may initially be uncertain. The multiplication factor is therefore determined instead by circuitry within the ratio logic 406 upon initial startup (or after each frequency shift) and compared with the programmed multiplication factor (e.g., from configuration register 409) to determine the clock-frequency division needed to yield the desired output clock frequency.

In the embodiment of FIG. 7, the first CMU stage 402 is implemented by a flexible-injection-rate clock multiplier or "flexible clock multiplier" shown, for example, in embodiment 411. The second CMU stage 404, if present at all, may be implemented by a clock multiplying ILO, multi-bank MILO (e.g., as described above in reference to FIGS. 1-6), flexible clock multiplier or any other clock multiplying circuit. Also, as shown, either of the CMU stages 402, 404 may be bypassed (i.e., via multiplexers 403 and 404) in accordance with the net multiplication required within the host system.

Still referring to FIG. 7, flexible clock multiplier (FCM) 411 includes a delay line 415, pulse generator 417, flexible injection-rate ring oscillator 419, and dual-loop delay-stage controller 421, which respond to control information (e.g., optional multiplier information, "Multiplier," and mode information, "Mode") to generate a frequency-multiplied output clock, $CLK_{FCM}$, in response to a variable-frequency input clock, $CLK_{IN}$. In addition to initiating calibration and configuration actions, the mode information specifies one of at least two multiplying modes within the FCM illustrated conceptually at 425. More specifically, in a fixed-multiplier mode, FCM 411 generates an output clock that is a fixed (e.g., hardwired, programmed or otherwise predetermined) frequency multiple of the input clock. Thus, as the input clock is stepped incrementally between various reference frequencies, f1, f2, f3, etc., the output clock tracks the frequency changes, transitioning from nf1 to nf2, to nf3, etc., incurring a lock time with each frequency change. By contrast, in a fixed-frequency mode, FCM 411 generates a fixed-frequency output (frequency=$f_{OUT}$), even as the input clock is binary-stepped between different frequencies (e.g., $f_{OUT}/8$, $f_{OUT}/4$, $f_{OUT}/2$, $f_{OUT}/1$) in effect establishing a different clock multiplier for each input clock frequency. Operation in each of these modes is discussed in further detail below.

Referring again to the detail view of FCM 411, the input clock, $CLK_{IN}$, propagates through the stages 425 (or delay elements) of delay line 415 to yield a time-staggered series of pulses that are supplied in selected pairs to the pulse generator 417. Pulse generator 417, in turn, outputs injection pulses 418 (generated in response to the delay-line inputs) to flexible-injection-rate ring oscillator 419 (the pulse injection being shown conceptually by injection port 429) to effect injection-locked generation of output clock, $CLK_{FCM}$. The operation of each of these components is described in further detail below.

Still referring to FCM 411, dual-loop delay-stage controller 421 receives the input clock as well as the clock outputs from ring oscillator 419 (e.g., $CLK_{FCM}$ as shown, or a tap from another stage within the ring oscillator) and delay line 415, and performs closed-loop timing control operations with respect to the two clock outputs at different times. More specifically, as shown in FIG. 8A, during an first calibration phase 451, referred to herein as an "initial tuning" phase, dual-loop delay-stage controller 421 adjusts a delay-element control value (shown as signal 420 within FCM 411) as necessary to tune the natural frequency of ring oscillator 419 to approximately n*$F_B$, where $F_B$ is a base frequency (e.g., lowest non-zero frequency) of the input clock. The delay-element control value 420 is supplied to both ring-oscillator 419 and delay line 415 and to establish matched delays within respective delay elements (425, 427) that constitute those circuit blocks. In a number of embodiments, the number of delay-elements or delay-stages 425 within delay line 415 is an integer multiple, DR ("delay-ratio"), of the number of delay-elements 427 within ring oscillator 419. Consequently, in a differential ring oscillator embodiment, the tuning operation at 451 establishes the delay-line propagation time to be approximately the delay-ratio times half the period of the ILO output clock (i.e., DR/(2*n*$F_B$), where denotes multiplication and n is the frequency multiplication factor effected by the FCM). This yields nominal phase alignment between the clocks input to and output from delay line 415 following the initial tuning operation. In the embodiment of FIG. 7, for example, the stage ratio is 8 (32 delay stages within delay element 415 to four delay stages within the ring oscillator 419) so that the delay-line propagation time is nominally $4T_{CLKIN}$/n (four times the input clock period divided by the multiplication factor), thereby nominally aligning the input clock and delay line output for multiplication factors 1, 2, 4 and 8. This nominal alignment is leveraged in a second "drift compensation" calibration phase shown at 453 in FIG. 8A. More specifically, after the initial calibration is disabled, a periodic calibration is effected by closed-loop adjustment of the delay-line propagation time to align the delay-line output with the input clock. The result is a delay-locked loop (DLL) through delay line 415 that provides twofold benefits of establishing a potentially more accurate delay-stage calibration and compensating for voltage and temperature drift. That is, the DLL formed by delay line 415 and delay-stage controller 421 more precisely aligns the injection pulse rate with the incoming reference clock, in effect, correcting for delay inaccuracy that remains after the initial-phase tuning operation, and adjusts per-stage propagation delays within delay line 415 and ring oscillator 419 as necessary to maintain desired frequency/phase relationships as environmental conditions change. In battery-powered or other power-sensitive systems, the drift compensation loop closure (i.e., determination of phase error between input clock and delay line and compensation therefore) may be performed only as often as necessary to compensate for relatively slow changes in environmental conditions, such as temperature and voltage.

Figure 8B:
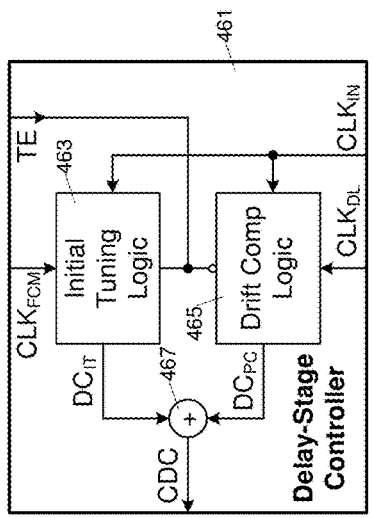
FIG. 8B illustrates an embodiment of a delay-stage controller that may be used to implement the delay-stage controller within the flexible clock multiplier of FIG. 7.

FIG. 8B illustrates an embodiment 461 of delay-stage controller 421 of FIG. 7. As shown, delay stage controller 461 includes initial tuning logic 463 and drift compensation logic 465, each enabled at different times to effect the respective calibration phases shown at 451 and 453 of FIG. 8A. Initial tuning logic 463 receives the input clock ($CLK_{IN}$) and the ring-oscillator output clock ($CLK_{FCM}$) and, when enabled by enable-tuning signal (TE), generates or updates an initial-tuning delay control signal, $DC_{IT}$. The initial-tuning delay control signal is summed with the output of drift compensation logic 465 in summing circuit 467 to produce a composite delay control signal, CDC. The composite delay control signal may be supplied to both the ring oscillator and delay line of an FCM (e.g., as signal 420 in FCM 411 of FIG. 7) to control the propagation delay through individual elements therein. In one embodiment, the output of the drift compensation logic 465 is set to a zero or null value at system startup (or at select times during system operation) so that the tuning-delay control signal establishes the initial value of the composite delay control signal, CDC, and thus the initial delay-element propagation time within the ring oscillator and the delay-line.

Still referring to FIG. 8B, drift compensation logic 465 receives the input clock and the delay-line output ($CLK_{DL}$) and, when the enable-tuning signal is deasserted (thus indicating completion of the initial tuning phase), periodically updates a periodic-calibration delay control signal, $DC_{PC}$. The periodic-calibration delay control signal is added to or otherwise combined with the initial-tuning delay control signal in summing circuit 467 to generate the composite delay control signal, CDC. Thus, the initial-tuning delay control signal, developed by loop closure through the ring oscillator, may be considered to establish the initial, coarse calibration of the delay-elements within the ring oscillator and delay line of the FCM, while the periodic-calibration delay control signal, developed by loop closure through the delay-line, fine-tunes the delay-element propagation time, correcting for misalignment remains after initial tuning and providing ongoing drift compensation.

Figure 8E:
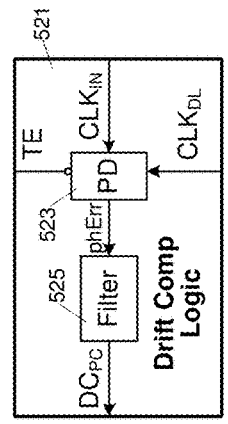
FIG. 8E illustrates an embodiment of a drift compensation logic circuit that may be used to implement the drift compensation logic shown in FIG. 8B.
Figure 8A:
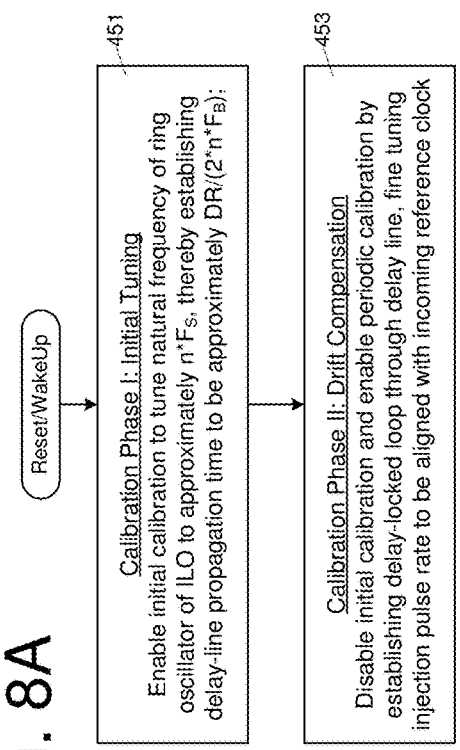
FIG. 8A illustrates exemplary initial-tuning and periodic-calibration phases of respective closed-loop timing control operations that may be carried out within the flexible clock multiplier (FCM) of FIG. 7.
Figure 8D:
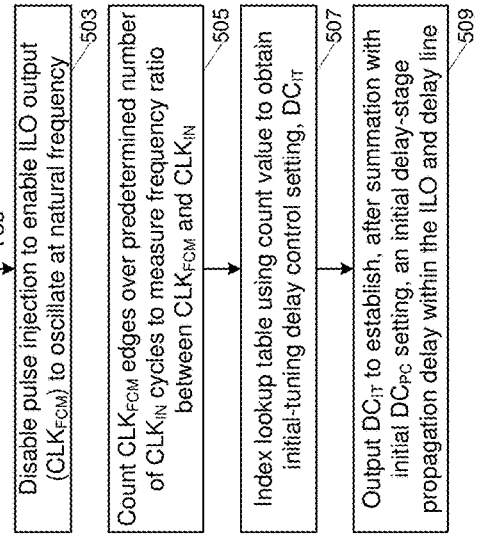
FIG. 8D illustrates an exemplary initial-tuning (calibration) operation that may be carried out by the initial tuning logic of FIG. 8C.
Figure 8C:
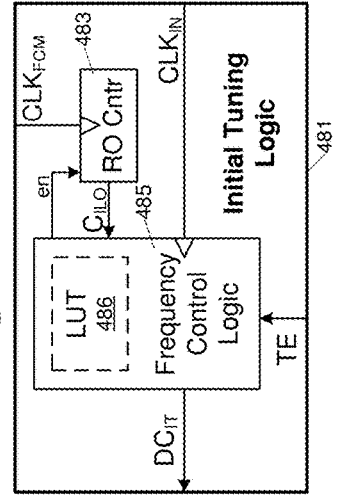
FIG. 8C illustrates an embodiment of an initial-tuning logic circuit that may be used to implement the initial tuning logic shown in FIG. 8B.

FIG. 8C illustrates an embodiment of an initial-tuning logic circuit 481 that may be used to implement initial tuning logic 463 of FIG. 8B. As shown, initial tuning logic 481 includes a ring-oscillation (RO) counter 483 coupled to receive the ring oscillator output clock ($CLK_{FCM}$), and frequency control logic 485 that receives the input clock, as well as the tune-enable signal (TE) discussed above. As shown by the exemplary flow diagram in FIG. 8D, when the tune-enable signal is asserted (affirmative determination at 501), pulse-injection into the ring oscillator is disabled at 503 to enable output clock $CLK_{FCM}$ to oscillate at the natural frequency of the ring oscillator (as opposed to an injection-locked frequency). Shortly thereafter, frequency control logic 485 raises a count-enable signal ("en") at an enable input of ring-oscillation counter 483 for a predetermined number of input clock cycles, thereby enabling the ring-oscillation counter to count output clock edges as shown at 505 and thus generate a measure of the frequency ratio between input clock $CLK_{IN}$ and the FCM (and ring oscillator) output clock, $CLK_{CFM}$. In the embodiment shown, frequency control logic 485 includes a lookup table 486 containing tuning values corresponding to the delay-stage correction needed for various ratios of the input and output clocks. Accordingly, as shown at 507 of FIG. 8D, frequency control logic 485 indexes lookup table 486 using the output-clock edge count to obtain the initial-tuning delay control value, $DC_{IT}$, discussed above. At 509, frequency control logic 485 outputs the initial-tuning delay control value to establish (after summation with the initial or residual delay setting from the drift-compensation logic) an initial delay-stage propagation delay within the ring oscillator and delay line of the FCM. In alternative embodiments, frequency control logic 485 may calculate rather than lookup the initial-tuning delay control value, for example, using a heuristic, analytic solution, mathematical model, etc. Also, instead of setting (or adjusting) the initial-tuning delay control value in a single adjustment operation, frequency control logic 485 may iteratively adjust the initial delay control value until the loop frequency error (i.e., difference between counted ring-oscillator clock edges and desired ring-oscillator clock edges) drops below a threshold or dithers about a target. Lookup table 486 may be omitted in such an iteratively-adjusted embodiment.

FIG. 8E illustrates an embodiment of a drift compensation logic circuit 521 that may be used to implement drift compensation logic 465 of FIG. 8B. Drift compensation logic 521 includes a phase detector 523 (PD) coupled to receive the input clock ($CLK_{IN}$), delay-line clock ($CLK_{DL}$), and tune-enable (TE) signals discussed above, and a filter circuit 525 that filters the output of the phase detector to generate periodic-calibration delay control value, $DC_{PC}$. Phase detector 523 responds to deassertion of the tune-enable signal TE (i.e., indicating that the initial tuning phase has concluded) by iteratively determining a phase difference between the input clock and the output of the delay-line ($CLK_{DL}$) and generating a phase-error signal (phErr) according to the phase difference detected, if any. In one embodiment, phase-detector 523 is a "bang-bang" digital phase detector that outputs a digital phase-error signal (e.g., up/down signals) to indicate which clock edge is received before the other. For example, the digital phase detector may sample the input clock state in response to a delay-line clock edge, or vice-versa, so that the high or low state of the sample value indicates whether the sampled clock transitioned before or after the sample-triggering clock edge. In an alternative embodiment, phase detector 523 may be a "linear" or "proportional" phase detector that outputs a phase-error signal indicating the magnitude and direction (leading/lagging) of the phase difference between the clock edges, for example by integrating charge over the interval between the clock edges. In either case, filter 525 accumulates or otherwise filters the iteratively generated phase-error signal to produce the periodic-calibration delay control value, $DC_{PC}$. In one embodiment, for example, filter 525 may be implemented by a charge pump that increments and decrements the charge on a capacitive element (i.e., in response to the phase-error signal) to produce an analog delay control value. In another embodiment, filter 525 may include an up/down counter that decrements an up/down count value in response to the phase-error signal to produce a digital delay control value. Various alternative filter implementations may also be used and, in any implementation that generates an analog or digital output, a converter (analog-to-digital or vice-versa) may be provided to generate the output in an alternate format. Also, though not specifically shown, iteration timing circuitry may be provided within phase detector 523, for example, to lower the loop bandwidth (e.g., by reducing the iteration rate of the DLL effected by the delay line and drift compensation logic) to the rate needed to compensate for temperature and voltage drift. The iteration timing circuitry may also establish different loop bandwidths at different times, enabling a relatively high loop bandwidth shortly after the tune-enable signal is deasserted (thus enabling rapid alignment between the delay-line output and input clock). The iteration timing circuitry can then transition to a slower, drift-compensation bandwidth after detecting that an initial alignment state has been reached (e.g., after detecting dithering of the phase error).

FIG. 9A illustrates an embodiment of a CML delay element 550 (or delay stage) that may be used to implement delay elements 425 and 427 within the delay line 415 and the ring oscillator 419, respectively, of FIG. 7. In general, delay element 550 is constructed in the same manner as the delay-element described in reference to FIG. 3A (i.e., including input transistors 192a/192b and current source 193), except that injection port 561 has been generalized to emphasize that various different injection techniques and circuits may be employed. Examples include the CML injection circuit shown in FIG. 3A (i.e., formed by current source 195 and injection-input transistors 194a/194b), as well other injection circuits described below. Also, exemplary variable-capacitance 557($C_L$) and variable-resistance ($R_L$) elements 557, 559 that may be adjusted (or trimmed or varied) to increase or reduce the propagation delay between input and output signal transitions are shown explicitly. As discussed, by using the same delay element within the ring oscillator and the delay line of the FCM (and in the latter case, tying the injection-port inputs to a non-injecting state), the delay through the ring oscillator and delay line stages may be inherently matched and thus made to track one another through the initial tuning operation and subsequent drift compensation operations discussed above.

In one embodiment, the composite delay control (CDC) value output by the delay-stage controller shown in FIG. 8B is used to control both the capacitance of capacitive element 557 and the resistance of resistive element 559. For example, in a digital implementation of the resistive and capacitive elements, shown in the embodiments of FIGS. 9B and 9C, respectively, constituent bits of a six-bit CDC (composite delay control) value are applied to switchably couple respective binary-weighted sub-elements between input and output nodes that form the terminals of the variable-load element. In the exemplary variable-resistance element 575 shown in FIG. 9B, for instance, each of the CDC bits is coupled to the gate terminal of a respective P-type MOS (PMOS) load transistor $577_0$-$577_5$ (collectively, 577) coupled between input and output nodes 576a, 576b of the resistive element. The PMOS load transistors 577 have binary-weighted widths and thus form respective conductances, $G_U$, $2G_U$, $4G_U$, $8G_U$, $16G_U$, $32G_U$, where unit conductance "$G_U$" represents a desired conductance step as the CDC value is incremented or decremented. Transistor 579 is also coupled between input and output nodes 576a/576b and configured in a conducting state (e.g., gate terminal tied low) to establish a minimum conductance $G_F$ (maximum resistance), and thus a starting point for the conductance range to be spanned by the variable-resistance element. By this arrangement, when all CDC bits are high, all load transistors 577 are switched to a non-conducting state (conducting no current or negligible current) to establish a minimum conductance ($G_F$) or maximum resistance ($1/G_F$). When all CDC bits are low, all load transistors 577 are switched to a conducting state to establish a maximum conductance ($G_F$+$63G_U$) or minimum resistance ($1/(G_F$+$63G_U)$). Thus, as the CDC value is stepwise incremented from a minimum value (i.e., '000000b' where 'b' denoted binary) to a maximum value ('111111b'), the conductance of element 575 is decremented, in units of $G_U$, from maximum value $G_F$+$63G_U$ to minimum value $G_F$, and thus the resistance is incremented from minimum value $1/(G_F$+$63G_U)$ to maximum value $1/G_F$. In alternative embodiments, non-binary weightings may be used for individual resistive sub-elements (e.g., load transistors 577), and thermometer-coded configurations may be used to establish the weightings of individual resistive sub-elements.

The exemplary variable-capacitance element 595 shown FIG. 9C is constructed similarly to the variable-resistance element of FIG. 9B. However, instead of resistive elements, binary-weighted capacitive elements $597_0$-$597_5$ (i.e., each having a respective capacitance, $2^iCu$, where 'i' ranges from 0 to 5) are switchably coupled between input and output nodes 596a/596b by respective switch elements 598, and a minimum-capacitance element 599 (establishing minimum capacitance $C_F$) is provided instead of minimum conductance element $G_F$. By this arrangement, as the CDC value is stepwise incremented from a minimum value ('000000b') to a maximum value ('111111b'), the capacitance of element 595 is incremented, in units of $C_U$, from minimum value $C_F$ to maximum value $CF+63C_U$. In alternative embodiments, non-binary weightings may be used for individual capacitive elements, and thermometer-coded configurations may be used to establish the weightings of individual resistive elements.

FIG. 9D illustrates an embodiment of a CMOS delay-element 610 that may be used to implement delay-elements 425 and 427 within the delay line 415 and ring oscillator 419, respectively, of FIG. 7. Delay element 610 includes a pair of CMOS inverter elements, 611 and 613, coupled to receive a differential input $S_{IN}+/S_{IN}-$ and to generate, in response, a differential output $S_{OUT}+/S_{OUT}-$. The slew rates and thus the propagation delays of inverter elements may be adjusted, for example, by adjusting the inverter supply voltages $V_{CDC}+$ and $V_{CDC}-$. In one embodiment, for example, as the CDC value output by a delay-stage controller (e.g., controller 461 of FIG. 8B) is increased from a minimum to a maximum value, the inverter supply voltage (i.e., difference between $V_{CDC}+$ and $V_{CDC}-$) is stepwise decreased from a maximum to a minimum value, thus incrementing the net propagation delay through the delay element. Latching inverters 615, 617 may optionally be coupled between $S_{OUT}+$ and $S_{OUT}-$ as shown to mitigate timing skew between outputs of inverters 611 and 613 (e.g., due to different rising-edge/falling-edge slew rates), and injection port 619 may also be coupled between the outputs of inverters 611 and 613 to enable injection locking as discussed below. As in the CML delay-element embodiment of FIG. 9A, the inputs to the injection port may be tied to a non-injecting state to suppress signal injection when delay-element 610 is deployed within the delay line of FIG. 7.

Figure 10A:
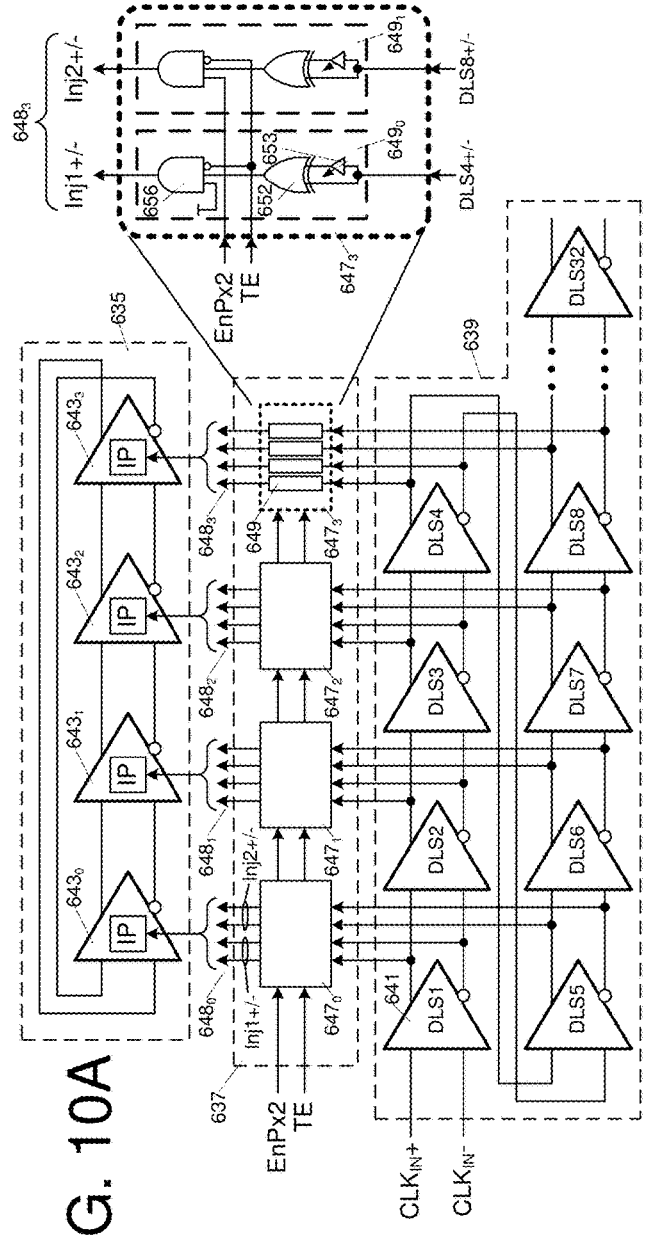
FIG. 10A illustrates embodiments of a flexible-injection-rate ring oscillator, injection pulse generator and delay line that may be used to implement like-named functional circuits within the flexible clock multiplier of FIG. 7.

FIG. 10A illustrates embodiments of a flexible-injection-rate ring oscillator 635, injection pulse generator 637 and delay line 639 that may be used to implement like-named functional circuits within the flexible clock multiplier of FIG. 7. In the example shown, the delay-line is formed by a sequence of 32 daisy-chained differential delay stages 641 (i.e., outputs of a given delay stage or delay element coupled to the inputs of the next delay stage in the chain), with the inputs of the first delay stage (DLS1) coupled to receive a differential input clock, $CLK_{IN}$ (having complementary components $CLK_{IN}+$ and $CLK_{IN}-$). The outputs of different pairs of delay stages DLSi and DLSi+4 are provided to respective pulse-generator circuits $647_0$-$647_3$ within injection pulse generator 637. Thus, the outputs of delay stages 1 and 5 (DLS1 and DLS5) are provided to pulse generator circuit $647_0$, the outputs of delay stages 2 and 6 are provided to pulse generator circuit $647_1$, the outputs of delay stages 3 and 7 are provided to pulse generator circuit $647_2$ and the outputs of delay stages 4 and 8 are provided to pulse generator circuit $647_3$. As explained below, this phasing arrangement yields pulses that occur at successive rising and falling edges of the output clock waveform, even as the frequency of the input clock is shifted between binary sub-multiples (or binary fractions) frequencies of output frequency, $f_{OUT}$ (i.e., between any two frequencies, $f_{OUT}$, $f_{OUT}/2$, $f_{OUT}/4$ and $f_{OUT}/8$ in this example).

Still referring to FIG. 10A, each of the pulse generator circuits $647_0$-$647_3$ generates a respective pair of differential injection-pulse outputs $648_0$-$648_3$ in response to the delay-stage outputs (i.e., each including Inj1+/− and Inj2+/−) and in accordance with control signals, tune-enable (TE) and 2x-enable (EnPx2). In the embodiment shown, the ring oscillator is formed by four differential delay stages $643_0$-$643_3$ (e.g., delay matched to the delay stages of the delay-line) each having an injection port ("IP") coupled to receive the injection-pulse outputs from a respective pulse generator circuit $647_0$-$647_3$, thus enabling the ring oscillator frequency to injection-lock to a frequency corresponding to the injection-pulse rate.

In one embodiment, shown in FIG. 10A by the expanded view of pulse generator $647_3$, each of the pulse generator circuits $647_0$-$647_3$ includes a pair of differential edge multipliers $649_0$ and $649_1$ (collectively, 649) each coupled to receive a respective phase-delayed differential reference clock and having an edge-pulse generator (e.g., implemented by differential XOR logic 652 and differential delay element 653) and differential AND logic 656. The edge-pulse generator operates generally in the manner described in reference to the pulse generator 161 of FIG. 3A to generate a differential pulse in response to each transition (edge) of the incoming clock, thereby supplying a pulse stream having twice the edge rate of the incoming clock to a first non-inverting input of AND logic 656. Because delayed pulses are already available through the delay chain, additional delay elements in the pulse generator may be omitted. One or more additional edge-pulse generators may be provided within each edge multiplier 649 to enable further multiplication of the edge rate within the outgoing pulse stream relative to the incoming clock, including edge-pulse generators that may be selectively (programmably) engaged or bypassed to provide configurable control the edge-rate multiplication factor.

Within each edge multiplier 649, AND logic 656 additionally receives the tune-enable signal (TE) at an inverting input and thus permits pulses to be passed to the output only if the tune-enable signal is deasserted. By this arrangement, pulse-injection may be disabled during the initial tuning phase of the flexible injection-rate clock multiplier as discussed above. The 2x-enable signal is supplied to a second non-inverting input of AND logic 656 within edge multiplier $649_1$, thus selectively enabling/disabling the injection-pulse outputs of that edge multiplier (i.e., Inj2+/−) according to the state of the 2x-enable signal. By contrast the second non-inverting input of AND logic 656 within edge multiplier $649_0$ is tied high (or alternatively, AND logic 656 within edge multipliers $649_0$ may be implemented by a two-input logic gate). Overall, AND logic 656 selectively disables pulse injection according to the state of the tune-enable signal, and controls the number of injection-pulses supplied per cycle of the output clock signal according to the state of the 2x-enable signal.

Figure 10B:
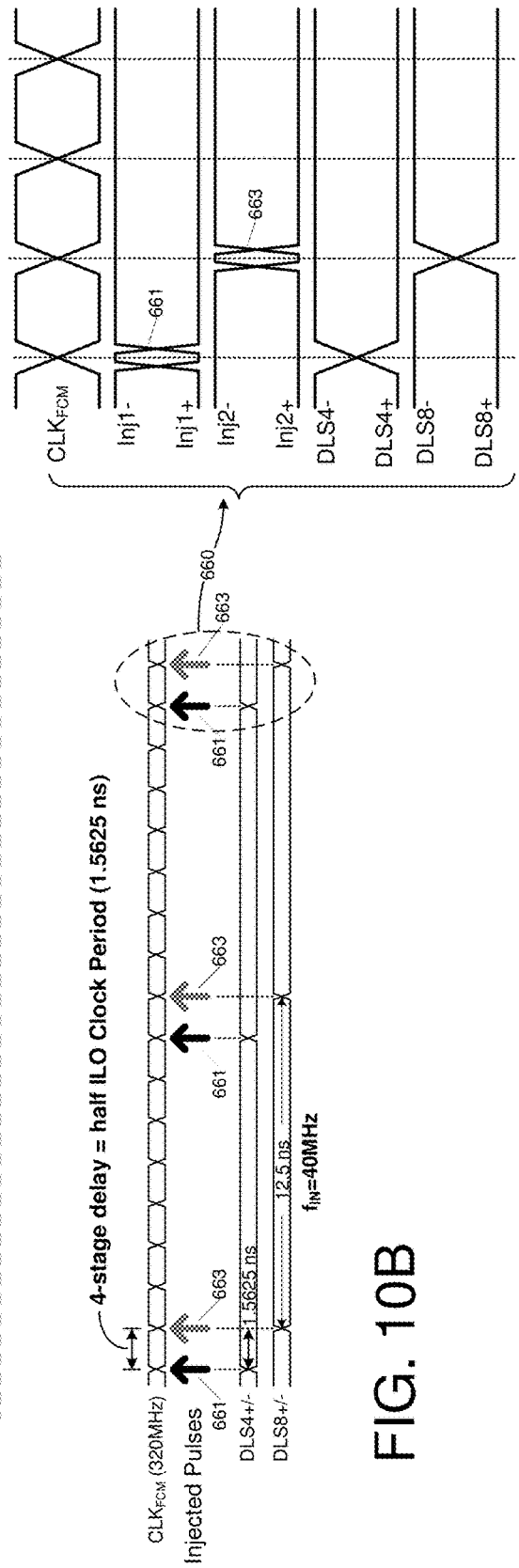
FIG. 10B illustrates an exemplary sequence of injection pulses generated by injection pulse generator of FIG. 10A.

FIG. 10B illustrates an exemplary sequence of injection pulses generated by injection pulse generator 637 of FIG. 10A. In the particular example shown, the incoming clock has a reference frequency of 40 MHZ ($f_{REF}$=40 MHz), and the overall clock multiplier performs an 8x frequency multiplication to produce a 320 MHz injection-locked output clock ($CLK_{CFM}$). By virtue of the initial tuning operation and subsequent loop closure through the delay line of the clock multiplier, the net delay through the four delay stages of the differential ring oscillator 635 of FIG. 10A is approximately half the ring-oscillator (output) clock period or 1.5625 ns. Further, due to the matched delay between delay stages within the ring oscillator and delay line, the net delay between the outputs of delay-line stages i and i+N is also approximately half the output clock period (i.e., $T_{CLKCFM}/2$). Consequently, as shown in detail view 660, differential injection pulses 661 and 663 corresponding to successive edges in the outputs of delay-line stages i and i+N (i.e., stages DLS4 and DLS8 in this example), are offset according to the desired timing offset between successive rising and falling edges in the output clock ($CLK_{CFM}$) waveform. A number of injection techniques and circuits that enable locking with respect to injection signals synchronized to both rising and falling edges of the output clock are discussed below.

Still referring to FIG. 10B, the bold injection pulses 661 are generated by edge multiplier $649_0$ (i.e., within pulse generator $647_3$) in response to each rising and falling edge of differential clock DLS4+/−(the output of delay-line stage DLS4), while the shaded injection pulses 663 are generated by edge multiplier $649_1$ in response to each rising and falling edge of differential clock DLS8+/−. The differential outputs of both edge multipliers $649_0$ and $649_1$ are supplied to the injection port of delay stage $643_3$ within ring oscillator 635 as shown in FIG. 10A.

Figure 10C:
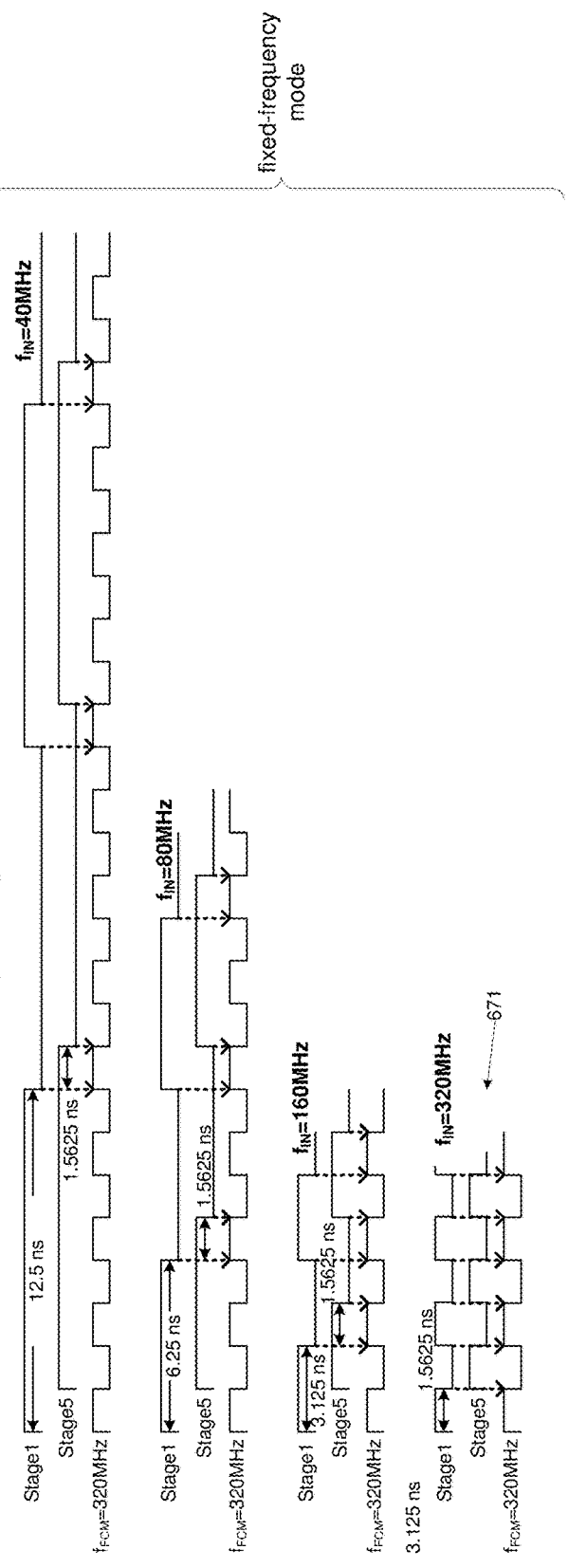
FIG. 10C illustrates exemplary input and output clock waveforms and their relationship to injection pulses generated in a fixed-frequency operating mode of the flexible clock multiplier circuits shown in FIG. 10A.

A significant characteristic of the injection pulse sequence shown in FIG. 10B is that the timing offset between pulses 661 and 663 is independent of the input clock frequency (excepting adjustment due to periodic calibration) and established instead by the per-stage propagation delay within the delay line (i.e., delay line 639 of FIG. 10A). Thus, even if the frequency of the input clock doubles or quadruples relative to that shown in FIG. 10B, the temporal spacing between injected pulses 661 and 663 (i.e., generated by delay stages 4 and 8 in this example) remains at the half-output-clock-period shown and thus enables the output clock to continue injection-locked oscillation at the same fixed frequency. This input-frequency-independent injection rate is exploited in the fixed-frequency mode of the FCM to enable rapid shifting of the input clock frequency between binary-stepped frequencies (e.g., f, 2f, 4f, 8f, etc.) without loss of lock. FIG. 10C, for example, illustrates this input-frequency independence, with injection pulses from stages 1 and 5 (shown by dashed arrows directed to successive edges of output clock having frequency $f_{FCM}$) being injected at desired rising and falling edge times over a half-output-clock cycle for each of reference clock frequencies 40 MHz, 80 MHz and 160 MHz. In the unity-multiplication operation shown at 671, the edges in stages 1 and 5 (or more generally, stages 'i' and 'i+4') are aligned with one another, but the desired injection timing still holds, enabling pulse-injection even as the input clock frequency is shifted to match the output clock frequency. Reflecting on the waveforms shown, it can be seen that in the 8× multiplication case (40 MHz input clock), two pulses are injected in succession over a half ILO period, followed by a 3.5 ILO period delay before next pulse-pair is injected. Thus, though pairs of pulses are delivered in respective half-output-clock-cycle intervals, the effective pulse injection frequency is two pulses for every four ILO cycles and thus a pulse per each two output clock cycles. Because the effective injection pulse frequency is lower than (e.g., half of) the output clock frequency, the pulse injection rate in the 8× multiplication case is referred to herein as a sub-harmonic injection rate. In the 4× multiplier case (80 MHz input clock), a 1.5 ILO period delay transpires between each injection pulse pair, establishing an effective pulse injection frequency equal to the output clock frequency and thus an "at-frequency" injection rate. In the 2× and 1× multiplier cases (160 MHz and 320 MHz input clocks, respectively), two pulses are injected per output clock cycle, thus establishing a 2× or "super-harmonic" injection rate. These varying injection rates (sub-harmonic, at-frequency and super-harmonic) present challenges for injection port implementation within the ring-oscillator, as further discussed below.

Figure 10D:
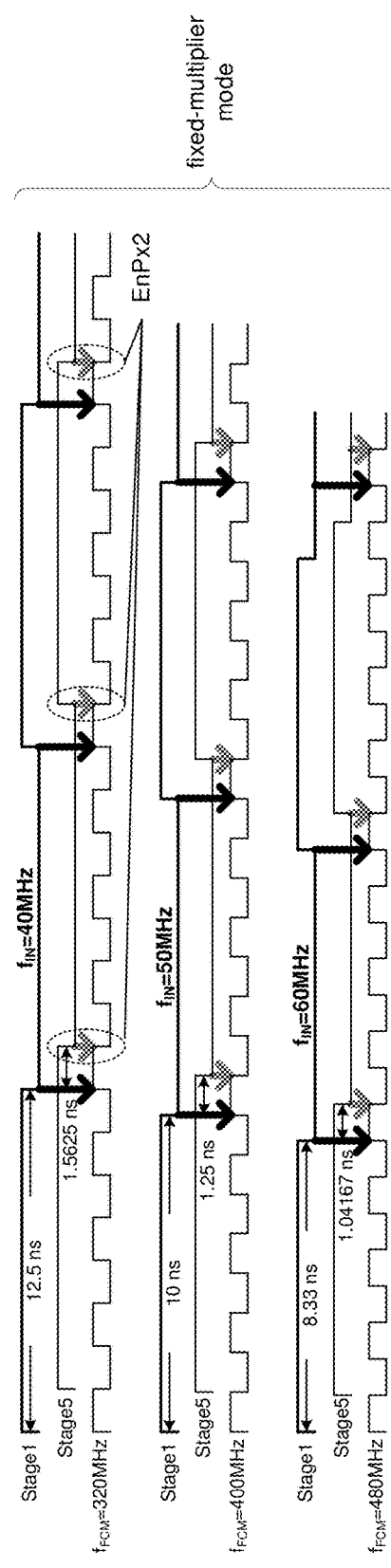
FIG. 10D illustrates exemplary input and output clock waveforms and their relationship to injection pulses generated in a fixed-multiplier operating mode of the flexible clock multiplier circuits shown in FIG. 10A.

Returning briefly to FIGS. 10A and 10B, when the flexible-injection-rate clock multiplier is operated in fixed-multiplier mode, the ×2-enable signal is deasserted during frequency-transition intervals to suppress super-harmonic pulse generation and instead limit the delay-line pulse outputs to those of a single set of delay stages corresponding to the ring oscillator delay stages. By this operation, the injection pulse rate becomes dependent upon the frequency of the input clock (instead of on the delay between selected stages within the delay line) and thus may be varied within a range corresponding to the lock range of ring oscillator 635 divided by N, the multiplication factor. For example, in a ring oscillator initially injection-locked at 320 MHz in response to a 40 MHz reference clock (thus forming an 8× multiplying ILO) and having a lock range that extends from approximately 320 MHz to 480 MHz (a range that may be extended by providing multiple, frequency-offset MILOs as discussed above), the reference clock may be varied to any frequency between 40 MHz to 60 MHz to yield a multiplied-by-eight (×8) output frequency ranging from 320 MHz to 480 MHz. Further, if the calibration loop is closed through the delay line (i.e., forming a DLL), then each frequency change will trigger progressive adjustment of the delay stages of the delay-line and ring oscillator, in effect tuning the delay stages in accordance with the shifted input clock frequency. After lock is achieved within the DLL (e.g., detected by dither in the phase detector output and/or phase error below a given threshold), the 2×-enable signal may be reasserted to establish the double pulse-injection rate shown in FIG. 10B (i.e., enabling generation of injection pulses at times indicated by the shaded arrows in addition to those indicated by the bold arrows) and thereby potentially reduce deterministic jitter in the output clock. FIG. 10D illustrates this fixed-multiplier operating mode, with the initial injection pulses bolded and the double-rate (2×-enable) pulses shown in gray as the input frequency changes from 40 MHz to 50 MHz to 60 MHz and the output frequency scales accordingly from 320 MHz to 400 MHz to 480 MHz. Although single-ended clock waveforms are shown in FIGS. 10C and 10D, all such clocks may be differential as discussed above.

Figure 10F:
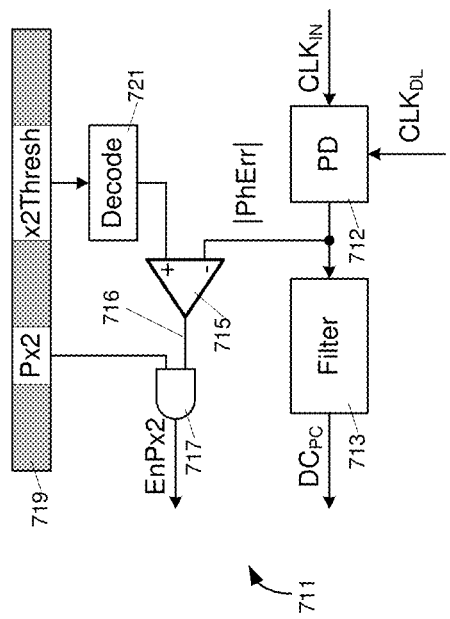
FIG. 10F illustrates an embodiment of a frequency-shift detector that may be used to detect a frequency shift in the clock signal supplied to the delay line of FIG. 10A.
Figure 10E:
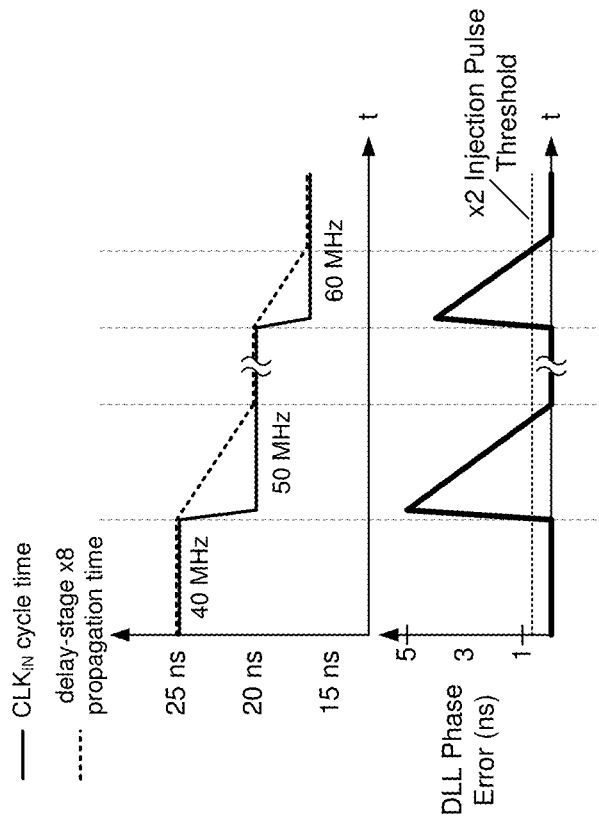
FIG. 10E illustrates an exemplary phase error between delay-line input and output clocks that may be used to detect a frequency shift in the clock signal supplied to the delay line of FIG. 10A.

In one embodiment, illustrated in FIGS. 10E and 10F, the magnitude of the phase error between the delay-line input and output clocks is used to determine when a frequency shift has taken place and to assert or deassert the 2×-enable signal mode accordingly. More specifically, as shown in FIG. 10E, as the input clock frequency transitions from 40 MHz to 50 MHz or from 50 MHz to 60 MHz (or in the opposite direction from a higher frequency to a lower frequency), the phase error between the delay-line input and output clocks spikes as shown. That is, even though the input clock period drops almost instantly (e.g., from 25 ns to 20 ns in the 40 MHz to 50 MHz transition), the delay line adjustment occurs more slowly in response to iterative corrections made by the DLL (note that although an incremental and thus linear correction profile is shown, a non-linear sequence of corrections proportional to the shrinking phase error may alternatively be applied) thus yielding the spiking DLL phase error profile shown. In the exemplary frequency-shift detector 711 shown in FIG. 10F, the magnitude of the phase error between $CLK_{IN}$ and $CLK_{DL}$ (i.e., the clocks input to and output from the delay line) detected by linear phase detector 712 is supplied to both filter 713 (which may generate a periodic-calibration delay control value, $DC_{PC}$, as discussed above) and to threshold comparator 715. Threshold comparator compares the magnitude of the phase error (|PhErr|) with a ×2 injection-pulse threshold, raising an over-threshold output 716 if the phase error magnitude exceeds the threshold (e.g., a "×2 Injection Pulse Threshold" as shown in FIG. 10E). In one embodiment, the ×2 injection-pulse threshold is generated by a decoder circuit 721 in response to a threshold code, "×2Thresh," programmed within a configuration register 719. In the embodiment of FIG. 10F, configuration register 719 also includes a ×2-enable field ("Px2") that may be programmed to an enabled state or disabled state and ANDed with the over-threshold signal (e.g., in AND gate 717), thereby permitting ×2 pulse injection to be selectively disabled without regard to whether the phase error magnitude exceeds the ×2 injection-pulse threshold. Though not specifically shown, the configuration register may alternatively (or additionally) include an override bit to enable ×2 pulse injection regardless of the phase error magnitude.

Figure 10G:
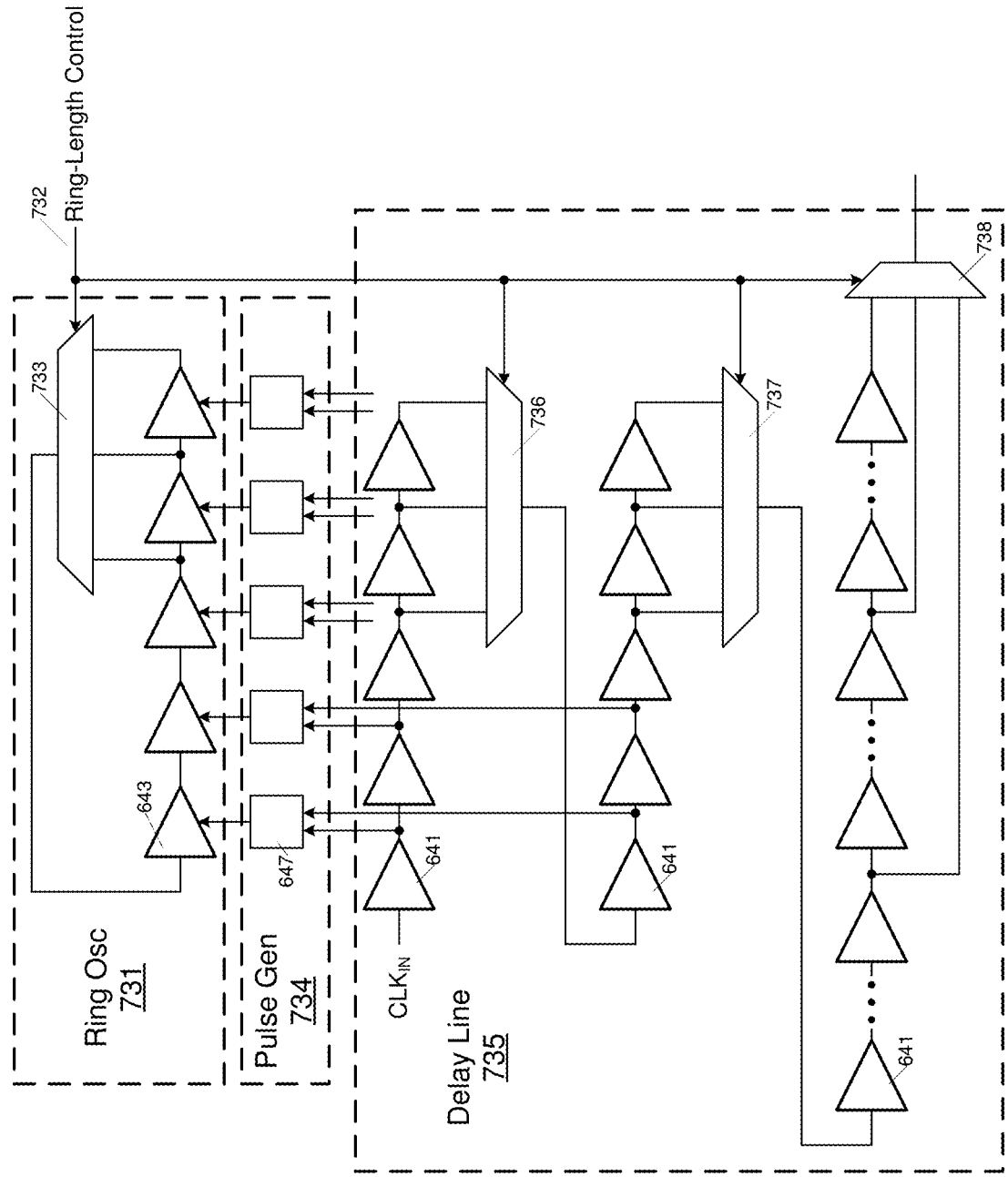
FIG. 10G illustrates alternative embodiments of a flexible-injection-rate ring oscillator, injection pulse generator and delay line that may be used to implement like-named functional circuits within the flexible clock multiplier of FIG. 7.

FIG. 10G illustrates alternative embodiments of a flexible-injection-rate ring oscillator 731, injection pulse generator 734 and delay line 735 that may be used to implement like-named functional circuits within the flexible clock multiplier of FIG. 7. The delay line 735 and ring oscillator are implemented by respective sequences of daisy-chained differential delay stages 641 and 643 as in the embodiment of FIG. 10A, but the number of delay stages in each circuit block is variable and selected according to a ring-length control signal 732. In the embodiment shown, for example, multiplexer 733 is provided to establish a ring length (i.e., number of delay stages in the ring oscillator) of three, four or five delay stages 643 (i.e., selecting the output of the third, fourth or fifth stage to be fed back to the first stage of the ring oscillator) according to the state of the ring-length control signal. By this arrangement, the frequency range of the ILO may be adjusted during initial configuration or dynamically during device operation to shift the lock frequency range of the oscillator. Multiplexers 736 and 737 are provided within delay line 735 to adjust the length of the ring-matching sequences of delay stages 641 and thus select a variable number of delay stages (and therefore a variable delay) between any two stages that source pulse-control edges to pulse generator circuits 647. Thus, if a ring-length of three is specified by ring-length control signal 732, multiplexers 736 is set to select the output of the third delay stage 641 to the next sequence of delay stages and thus establish a delay-stage spacing of three between any two stages that deliver clock signals to a given pulse generator circuit 647 (matching the number of delay stages selected within ring oscillator 731). Multiplexer 737 functions similarly to multiplexer 736 to control the overall number of stages that source clock signals to pulse generator circuits 647, and multiplexer 738 controls the overall number of delay stages within delay line 735 (e.g., selecting 24, 32 or 40 delay stages in a ×8 clock multiplier embodiment). Note that multiplexer stages 737 and 738 are shown separately for ease of understanding and may be replaced by a single multiplexer that selects the overall number of delay stages in an alternative embodiment. Similarly, though ring-lengths of 3, 4 and 5 delay stages are shown, wider and narrower range of ring-lengths may be supported in alternative embodiments. The ring-length control signal 732 may be established through register programming, fusible logic, device strapping or any other volatile or non-volatile selection mechanism.

As mentioned, when operated in fixed-frequency mode, the pulse injection rate within the clock multiplier of FIG. 7 may vary between sub-harmonic and super-harmonic rates according to the input frequency. The exemplary CML implementation shown in embodiment 741 of FIG. 11A (and depicted in the context of the injection port 561 of a CML delay stage 550 as described in reference to FIG. 9A) is capable of supporting sub-harmonic to super-harmonic injection rates. In sub-harmonic injection, only the Inj1+/− input port yields injection, while in super-harmonic injection the Inj2+/− input port provides injection with opposite polarity. This polarity inversion is appropriate because Inj2+/− injection occurs one half of an output clock period later than Inj1+/− injection, and thus when the output clock has opposite phase. When the CML injection embodiment 741 is used, the injection pulse timing alignment is somewhat different from that shown in the timing diagram of FIG. 10B. Instead of being aligned with $CLK_{FCM}$ transitions, injection pulses 661 and 663 lock in alignment with the $CLK_{FCM}$ pulse centers. Also, the injection pulse widths may be tuned to approximately equal the $CLK_{FCM}$ pulse width. The embodiment shown at 741 is somewhat inefficient in the sense that the CML injection drivers consume power continuously, even during output clock cycles when there are no injection pulses. An alternative technique, referred to herein as "null-injecting," may be used to achieve more efficient pulse injection that flexibly supports the sub-harmonic, at-frequency and super-harmonic injection rates shown in FIG. 10C.

In a null-injecting embodiment, injection pulses lock the oscillator such that output clock transitions are aligned with the injection pulses as shown in FIG. 10B. Accordingly, in contrast to the CML embodiment shown at 741, no polarity is associated with the null injection pulses, thus enabling their injection at both rising and falling transitions of the output clock without concern for injection pulse polarity. For example, in the CML null-injector embodiment shown at 761 of FIG. 11A, pulse-injection signals are supplied to control nodes of respective switch elements (i.e., to the gate terminals of respective FETs 765, 766, 767, 768 in the example shown) coupled between output nodes of the injection port (and thus coupled between output nodes of the delay stage 550). By this arrangement, the switch elements are closed briefly in response to incoming injection pulses thereby pulling the differential output of the delay-stage toward a null or equalized state at the injection pulse rate. So long as the pulse injection rate corresponds to a frequency within the lock range of the host ILO (i.e., ILO containing the delay-stage), the ILO will quickly lock to the incoming pulse stream.

In a CMOS null-injector, shown for example at 791 of FIG. 11B, injection signals are supplied to respective inverter elements 793, the outputs of which are supplied, in turn, to control nodes of switch elements 795. As in the CML null injector, the switch elements are coupled between output nodes of the injection port and thus, when closed in response to incoming injection pulses, pull the differential output of the CMOS delay-stage 610 toward a null or equalized state at the injection pulse rate. Again, the host ILO will quickly lock to the incoming injection pulse stream so long as the injection pulse rate corresponds to a frequency within the lock range of the ILO. Note that inverters 793 are provided to limit the edge rate produced by switch elements 795 and may be omitted in alternative embodiments, in which case the differential signals coupled to P-MOS and N-MOS switch elements 795 are flipped to establish the correct injection polarity. Also, the widths of the injected pulses may be different in the CML and CMOS null-injectors (e.g., through control over delay elements 653 of FIG. 10A), with the CML pulse widths being expanded, for example, to match the output clock widths. Also, as discussed above, the number of pulse generator circuits (and thus the edge rate multiplication factor effected within a given pulse injector) may be varied to achieve multiplication ratios ranging from unity to any practicable limit.

As discussed briefly in reference to FIGS. 1 and 7, the multiplication factor effected by clock multipliers 101 and 401 may be unknown (or uncertain) at system startup and determined instead by ratio logic (111 or 406) shortly after the clock multiplier output stabilizes. After determining the multiplication factor, the ratio logic selects a frequency-divided version of the clock multiplier output to yield an overall frequency multiplication specified by a programmed or hardwired multiplication setting (e.g., a multiplication factor from a configuration register).

Figure 12B:
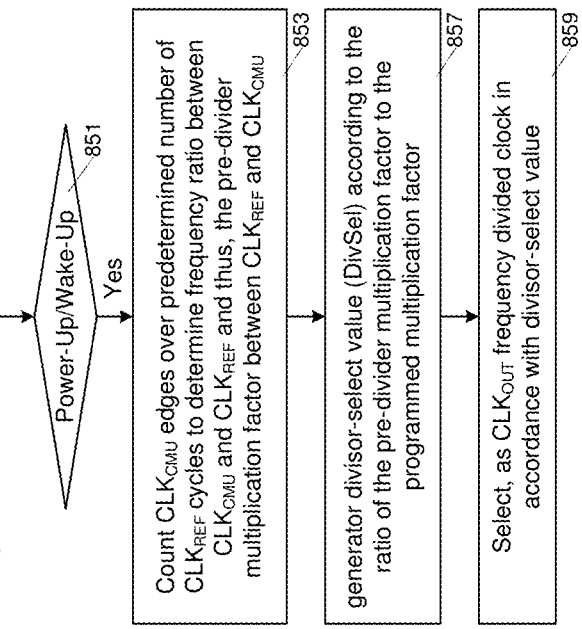
FIG. 12B illustrates an exemplary clock-divisor determination operation that may be carried out by the ratio logic of FIG. 12A to select a frequency divided instance of a clock signal generated by a clock multiplier.
Figure 12A:
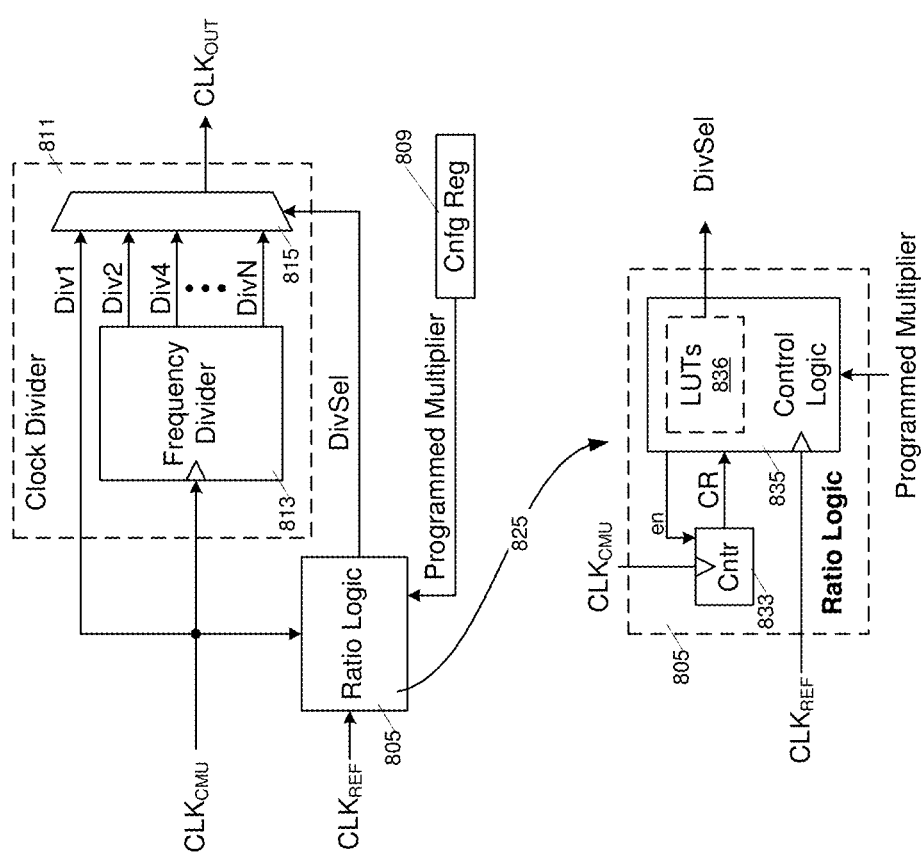
FIG. 12A illustrates an embodiment of a ratio logic circuit and its interconnection to a divider logic circuit and configuration register.

FIG. 12A illustrates an embodiment of a ratio logic circuit 805 and its interconnection to clock divider logic 811 and configuration register 809. As shown, clock divider 811 includes a frequency divider circuit 813 that generates a set of frequency-divided clocks (Div2, Div4, . . . , DivN) in response to the clock output by a clock multiplier ($CLK_{CMU}$), and a multiplexer 815 that selects, as a final output clock, $CLK_{OUT}$, one of the frequency-divided clocks in response to a divisor-select signal (DivSel) from ratio logic 805. In one embodiment, the frequency-divided clocks have frequencies $f_{CMU}/(2^i)$ (i.e., where $f_{CMU}$ is the frequency of the clock generated by the preceding clock multiplier, N is the maximum divisor, and 'i' ranges from 1 to $\log_2 N$), though different or additional frequency divisions may be generated in alternative embodiments. Also, an undivided version of $CLK_{CMU}$, shown in FIG. 12A as the "Div1" clock, may also be supplied to multiplexer 815 to permit an at-frequency instance (or unity-divisor instance or undivided instance) of the clock generated by the clock multiplier to be selected as the final output clock.

In one embodiment, shown in detail view 825, the ratio logic 805 includes an edge counter 833 to count edges of the multiplied clock, $CLK_{CMU}$, and control logic 835 to enable operation of the edge counter in response to a reference clock, $CLK_{REF}$ (i.e., the clock provided to the clock multiplier to enable generation of $CLK_{CMU}$). More specifically, as shown in flow diagram 12B, upon detecting a power-up or wake-up condition (affirmative determination at 851), control logic 835 counts $CLK_{CMU}$ edges over a predetermined number of reference clock cycles as shown at 853 (e.g., outputting count-enable signal "en" to edge counter 833 for the predetermined number of reference clock cycles) to determine the frequency ratio between the multiplied clock and reference clock, and thus the pre-divider multiplication factor effected by the upstream clock multiplier. Thereafter, at 857, control logic 833 generates a divisor-select value, DivSel, according to the ratio of the pre-divider multiplication factor and the programmed multiplication factor received from configuration register 809. In one embodiment, for example, control logic 833 includes logic to divide the pre-divider multiplication value by the programmed multiplication factor (e.g., right-shifting the pre-divider multiplier value in accordance with the programmed multiplier) to obtain a divisor value, applying the divisor directly as the DivSel output or translating/looking-up the DivSel value based on the divisor. In another embodiment, the one of the multipliers (pre-divider multiplier or programmed multiplier) may be used to select one of a number of lookup tables 836 (LUT) that may then be indexed by the other of the multipliers to obtain the DivSel value. In any case, as shown at 859 of FIG. 12B, control logic 805 outputs the DivSel value to multiplexer 815 to select, as the final output clock ($CLK_{OUT}$), a frequency-divided instance (including the Div1 instance) of the multiplied clock.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A clock generator comprising:
   a first input to receive an input clock;
   a second input to receive a mode value that effects one of multiple operating modes within the clock generator, the multiple operating modes including at least a first operating mode and a second operating mode; and
   a clock multiplier circuit to:
      generate an output clock that is a frequency-multiple of the input clock in the first operating mode such that the output clock transitions between different frequencies as the input clock transitions between different frequencies; and
      generate the output clock in the second operating mode such that a ratio between frequencies of the output clock and the input clock changes as the input clock transitions between different frequencies.

2. The clock generator of claim 1 wherein the clock multiplier circuit to generate the output clock in the first and second operating modes comprises an injection-locked oscillator.

3. The clock generator of claim 2 wherein the clock multiplier circuit to generate the output clock in the first operating mode comprises circuitry to generate a first sequence of pulses in response to the input clock and apply the first sequence of pulses to the injection-locked oscillator.

4. The clock generator of claim 3 wherein the clock multiplier circuit to generate the output clock in the first operating mode comprises circuitry to generate a second sequence of pulses in response to the input clock and apply the second sequence of pulses to the injection-locked oscillator.

5. The clock generator of claim 4 wherein the circuitry to generate the first sequence of pulses in response to the input clock comprises circuitry to suppress generation of every other pulse within the circuitry to generate the second sequence of pulses such that the first sequence of pulses comprises half as many pulses as the second sequence.

6. The clock generator of claim 4 wherein the circuitry to generate the second sequence of pulses comprises circuitry to establish a minimum time between successive pulses in the second sequence of pulses that is independent of the input clock frequency.

7. The clock generator of claim 6 wherein a minimum time between successive pulses in the first sequence of pulses changes as the input clock transitions between different frequencies.

8. The clock generator of claim 4 wherein the circuitry to generate the first sequence of pulses and the circuitry to generate the second sequence of pulses comprise:
   a delay line formed by a series-coupled sequence of delay elements and having an input to receive the clock signal; and
   selector circuitry to select outputs of a first subset of the delay elements to produce the first sequence of pulses and to select outputs of the first subset of the delay elements and a second subset of the delay elements to produce the second sequence of pulses.

9. The clock generator of claim 4 wherein the injection locked oscillator comprises first delay elements coupled to form a ring oscillator and, and wherein the circuitry to generate the first sequence of pulses and the circuitry to generate the second sequence of pulses comprise second delay elements coupled to form a delay line, each delay element of the first and second delay elements being biased to exhibit a propagation delay that nominally matches a propagation delay of each other delay element of the first and second delay elements.

10. A method of operation within an integrated circuit device, the method comprising:
    receiving an input clock;
    generating, in a first operating mode of the integrated circuit device, an output clock that is a frequency-multiple of the input clock such that the output clock transitions between different frequencies as the input clock transitions between different frequencies; and
    generating the output clock in a second operating mode of the integrated circuit device such that a ratio between frequencies of the output clock and the input clock changes as the input clock transitions between different frequencies.

11. The method of claim 10 wherein generating the output clock in the first and second operating modes comprises generating the output clock within an injection-locked oscillator.

12. The method of claim 11 wherein generating the output clock in the first operating mode comprises generating a first sequence of pulses in response to the input clock and applying the first sequence of pulses to the injection-locked oscillator.

13. The method of claim 12 wherein generating the output clock in the second operating mode comprises generating a second sequence of pulses in response to the input clock and applying the second sequence of pulses to the injection-locked oscillator.

14. The method of claim 13 wherein the second sequence of pulses comprises twice as many pulses as the first sequence.

15. The method of claim 13 wherein a minimum time between successive pulses in the second sequence of pulses is independent of the input clock frequency.

16. The method of claim 15 wherein a minimum time between successive pulses in the first sequence of pulses changes as the input clock transitions between different frequencies.

17. The method of claim 13 wherein generating the first sequence of pulses comprises suppress every other pulse within second sequence of pulses.

18. The method of claim 13 wherein generating the first sequence of pulses and the second sequence of pulses comprises supplying the input clock to a delay line formed by a series-coupled sequence of delay elements and selecting outputs of a first subset of the delay elements to produce the first sequence of pulses and selecting outputs of the first subset of the delay elements and a second subset of the delay elements to produce the second sequence of pulses.

19. The method of claim 13 wherein the injection locked oscillator comprises first delay elements coupled to form a ring oscillator, and wherein generating the first sequence of pulses and the second sequence of pulses comprises supplying the input clock to second delay elements coupled to form a delay line, each delay element of the first and second delay elements being biased to exhibit a propagation delay that nominally matches a propagation delay of each other delay element of the first and second delay elements.

20. A clock generator comprising:
a first input to receive an input clock;
a second input to receive a mode value that effects one of multiple operating modes within the clock generator, the multiple operating modes including at least a first operating mode and a second operating mode;
means for generating an output clock that is a frequency-multiple of the input clock in the first operating mode such that the output clock transitions between different frequencies as the input clock transitions between different frequencies; and
means for generating the output clock in the second operating mode such that a ratio between frequencies of the output clock and the input clock changes as the input clock transitions between different frequencies.

\* \* \* \* \*